(12) United States Patent
Yamada et al.

(10) Patent No.: US 7,589,352 B2
(45) Date of Patent: Sep. 15, 2009

(54) LIGHT EMITTING DEVICE

(75) Inventors: Masato Yamada, Annaka (JP); Masanobu Takahashi, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 532 days.

(21) Appl. No.: 10/577,477

(22) PCT Filed: Nov. 4, 2004

(86) PCT No.: PCT/JP2004/016346
§ 371 (c)(1),
(2), (4) Date: Apr. 27, 2006

(87) PCT Pub. No.: WO2005/043636
PCT Pub. Date: May 12, 2005

(65) Prior Publication Data
US 2007/0126019 A1 Jun. 7, 2007

(30) Foreign Application Priority Data
Nov. 4, 2003 (JP) ............................. 2003-375027
Nov. 4, 2003 (JP) ............................. 2003-375030

(51) Int. Cl.
*H01L 33/00* (2006.01)
(52) U.S. Cl. .......................................... 257/95; 257/99
(58) Field of Classification Search ................. 257/95, 257/99, 100, 790, 791
See application file for complete search history.

(56) References Cited
U.S. PATENT DOCUMENTS

| | | | | |
|---|---|---|---|---|
| 5,403,916 A | 4/1995 | Watanabe et al. | | |
| 6,323,063 B2 * | 11/2001 | Krames et al. | ............... | 438/116 |
| 6,710,377 B2 * | 3/2004 | Shimomura | ................... | 257/99 |
| 6,768,136 B2 | 7/2004 | Eisert et al. | | |
| 6,956,241 B2 | 10/2005 | Sugawara et al. | | |
| 2005/0255615 A1 | 11/2005 | Sugawara et al. | | |

FOREIGN PATENT DOCUMENTS

| | | |
|---|---|---|
| JP | A 5-327012 | 12/1993 |
| JP | 6-296040 | 4/1995 |
| JP | 7-111343 | 4/1995 |
| JP | 10-12929 | 1/1998 |
| JP | 11-191641 | 7/1999 |
| JP | A 11-354837 | 12/1999 |
| JP | 2000-124475 | 4/2000 |
| JP | 2002-190619 | 7/2002 |
| JP | A 2003-86838 | 3/2003 |
| JP | A 2003-298108 | 10/2003 |

* cited by examiner

*Primary Examiner*—Mark Prenty
(74) *Attorney, Agent, or Firm*—Oliff & Berridge, PLC

(57) ABSTRACT

A light emitting element (100) comprising an element chip (100C) provided, at least in a partial section in the thickness direction thereof, with a part of reduced cross-section where the cross sectional area decreases continuously or stepwise in the direction perpendicular to the thickness direction from the first major surface side toward the second major surface side. A part of a molded section (25) has a first mold layer (26) covering at least the part of reduced cross-section, and a second mold layer (25m) covering the outside of the first mold layer (26), wherein the first mold layer (26) is composed of a polymer mold material softer than that of the second mold layer (25m). A light emitting element, having such a structure that the element chip bonded onto a metal stage is not stripped easily even if mold resin expands, is thereby provided.

32 Claims, 14 Drawing Sheets

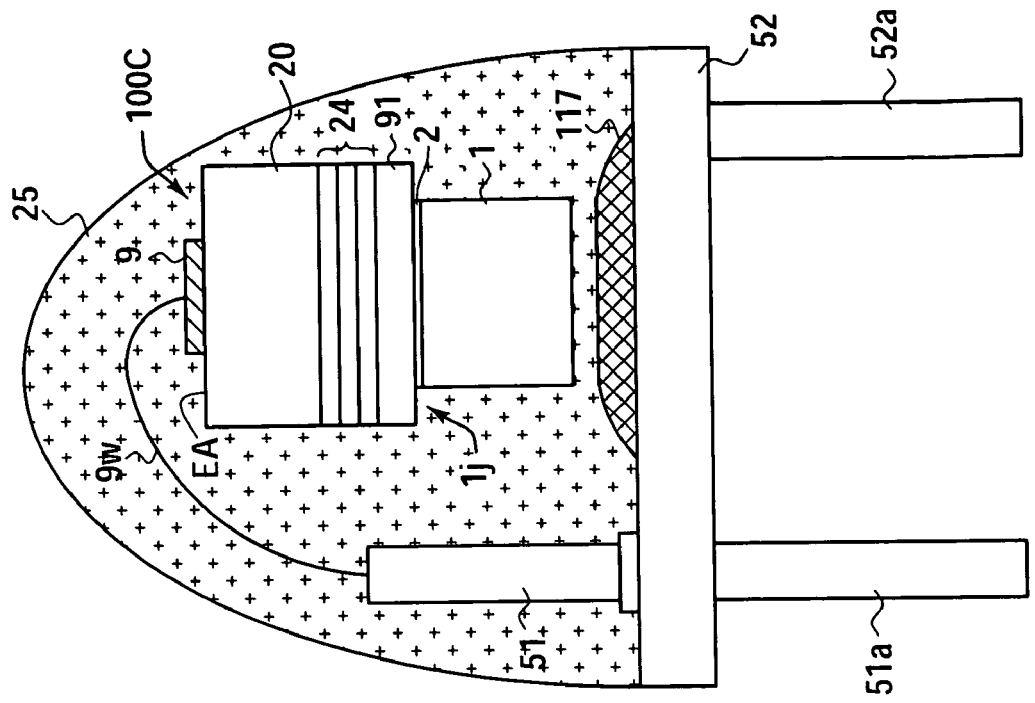
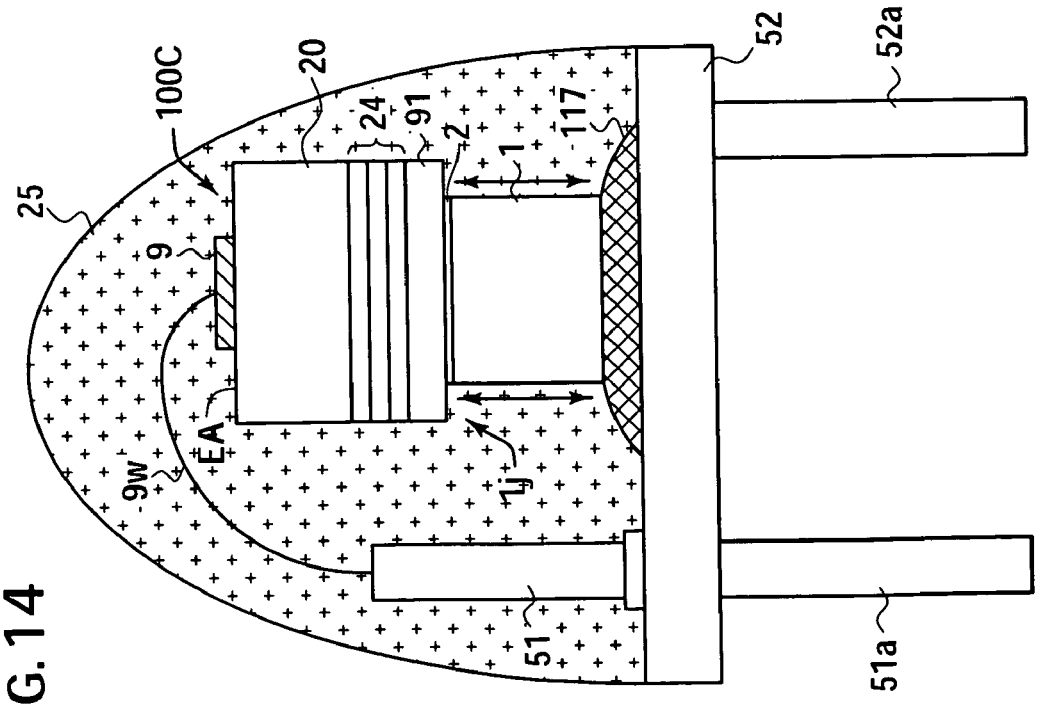
FIG. 14

LIGHT EMITTING DEVICE

BACKGROUND OF THE INVENTION

1. [Field of the Invention]

The present invention relates to a light emitting device.

2. [Description of the Related Art]

Light emitting device, developed aiming at realizing high-luminance-type ones which use AlGaInP, InAlGaN or the like as a basic material, have been becoming more closer to the theoretical limit of photo-electric conversion efficiency inside the device, as a result of advancement made in the materials and device structures over years. Light extraction efficiency from the device will therefore be a matter of great importance in view of obtaining devices of still higher luminance. One exemplary method generally adopted to obtain a higher light extraction efficiency relates to molding around a device chip using a high-refractive-index resin. More specifically, one widely known light emitting device has a device chip covered with an epoxy resin, as described in Japanese Laid-Open Patent Publication "Tokkaihei" No. 11-191641. The device chip in this case uses the bottom thereof as an emission operation end, so that it is often to adopt a configuration in which the bottom is adhered to a metal stage while placing a electro-conductive adhesive layer such as an Ag paste layer in between, so as to allow application of operation voltage for emission to the device chip, through an operation terminal provided on the metal stage. In this configuration, the device chip adhered onto the metal stage is molded together with the electro-conductive adhesive layer.

For the case where the device chip is resin-molded, most resins expand as being affected by temperature rise during emission operation, day-and-night temperature difference in an environment of use, direct irradiation by sunray in mid-summer, and so forth. Any expansion-induced stress applied to the device chip may result in separation of the device chip adhered on the metal stage, and in conduction failure with the metal stage. In particular for the case shown in FIG. 8 of Japanese Laid-Open Patent Publication "Tokkaihei" No. 6-296040, wherein a portion of a GaAs substrate, previously used for allowing the light emitting layer portion to grow thereon, is left unremoved on the bottom side of the device chip so as to allow adhesion on the bottom of the GaAs substrate, a problem arises in that a gap is formed between the light emitting layer portion and the metal stage, in a region where the GaAs substrate has been removed. The above-described expansion of the resin filled in such gap may result in a nonconformity such that the device chip floats as if being jacked up due to displacement caused by the resin expansion, separates from the adhesive layer, and results in illumination failure.

It is therefore an object of the present invention to provide a light emitting device having a structure less causative of separation of the device chip adhered on the metal stage even if the molding resin expands.

SUMMARY OF THE INVENTION (First Invention)

Aimed at solving the above-described subjects, a light emitting device according to a first aspect of a first invention is configured:

so that a device chip, having a light emitting layer portion and a main light extraction surface formed on the first main surface thereof, is adhered on the second main surface side thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion; and so that the device chip has a section reducing portion formed in at least a portion in the thickness-wise direction thereof, wherein the sectional area normal to the thickness-wise direction continuously or step-wisely decreases from the first main surface side towards the second main surface side, a portion of the molding component comprises a first molding layer covering at least the section reducing portion and a second molding layer covering the exterior of the first molding layer, wherein the first molding layer is composed of a polymer molding material softer than that composing the second molding layer.

It is to be noted herein that the "light extraction surface" throughout this patent specification means a surface of the device allowing emission flux to be extracted therethrough to the external, and "main light extraction surface" means the light extraction surface formed on the first main surface of the main compound semiconductor layer. Besides the above-described main light extraction surface, the side face of the main compound semiconductor layer, or the bottom surface of the cut-off portion formed on the second main surface of the compound semiconductor layer can configure the light extraction surface. The "main compound semiconductor layer" herein means a portion of the stack of compound semiconductor including the light emitting layer portion, obtained by halving, in the thickness-wise direction, the stack containing the light emitting layer portion by a plane containing the bottom surface of the cut-off portion.

A target to which the first invention is applied is a light emitting device chip having a section reducing portion formed in at least a portion in the thickness-wise direction thereof, wherein the sectional area normal to the thickness-wise direction continuously or step-wisely decreases from the first main surface side towards the second main surface side. Expansion of the molding material in contact with the section reducing portion, as being affected by temperature rise during emission operation, day-and-night temperature difference in an environment of use, direct irradiation by sunray in mid-summer, and so forth, may produce a stress so as to lift up the device chip from the adhesive layer, and may be causative of separation of the device chip. Whereas, in the first aspect of the first invention, the first molding layer in contact with the section reducing portion is configured using a resin softer than that composing the second molding layer covering the exterior of the first molding layer, so that the first molding layer can readily be compressed and deformed under such expansion so as to moderate a level of generated stress, and thereby the nonconformity such as separation of the device chip from the electro-conductive adhesive layer can effectively be suppressed.

More specifically, the second molding layer can be configured, in at least a portion thereof, using an epoxy resin. It is to be understood herein that any molding materials other than the epoxy resin (fluorocarbon resin such as polyvinylidene fluoride: harder than the silicone resin described later, as well as the epoxy resin) may be used in combination with the epoxy resin. For example, the second molding layer can be configured as having a multi-layered structure composed of an epoxy resin and a fluorocarbon resin.

Silicone resin can preferably be used as the soft polymer material composing the first molding layer. The silicone resin is generally soft, excellent in an effect of absorbing the expansion-induced displacement, excellent in transparency, easy in obtaining a liquidous uncured composition, and can thereby facilitate formation of the molding layer. More specifically, silicone resins (conceptually includes rubber and elastomer) generally used as junction coating resin (JCR) for preventing short-circuiting at p-n junction is preferably adoptable to the first aspect of the first invention.

A light emitting device according to a second aspect of the first invention is configured:

so that a device chip, having a light emitting layer portion and a main light extraction surface formed on the first main surface thereof, is adhered on the second main surface side thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion; and so that the device chip has a section reducing portion formed in at least a portion in the thickness-wise direction thereof, wherein the sectional area normal to the thickness-wise direction continuously or step-wisely decreases from the first main surface side towards the second main surface side, and the molding component is configured at least by a polymer molding material composed of a silicone resin, in the portion thereof covering the section reducing portion. In the second aspect of the first invention, a portion of the molding component in contact with the section reducing portion is configured using a silicone resin which is soft, excellent in an effect of absorbing the expansion-induced displacement, and excellent in transparency, so that the portion of the molding component can readily be compressed and deformed under such expansion so as to moderate a level of generated stress, and thereby the nonconformity such as separation of the device chip from the electro-conductive adhesive layer can effectively be suppressed.

A light emitting device according to a third aspect of the first invention is proposed from the viewpoint of hardness of the molding layer in contact with the section reducing portion, and is configured:

so that a device chip, having a light emitting layer portion and a main light extraction surface formed on the first main surface thereof, is adhered on the second main surface side thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion; and so that the device chip has a section reducing portion formed in at least a portion in the thickness-wise direction thereof, wherein the sectional area normal to the thickness-wise direction continuously or step-wisely decreases from the first main surface side towards the second main surface side, and the molding component is configured at least by a polymer molding material composed of a soft material having a type-A durometic hardness specified by JIS:K6253 of 50 or smaller, in the portion thereof covering the section reducing portion. An effect of absorbing the expansion-induced displacement and of preventing the separation of the device chip as a consequence becomes more distinctive, when the molding layer in contact with the section reducing portion has a type-A durometric hardness of 50 or smaller, so that any nonconformity such as separation of the device chip from the electro-conductive adhesive layer can effectively be suppressed.

On the other hand, there is a lower limit value for a preferable range of hardness of the molding layer in contact with the section reducing portion. The entire portion of the molding component can also be configured by solely using a silicone resin, if the silicone resin has the hardness of not smaller than an appropriate lower limit value (typically a type-A durometric hardness, specified by JIS:K6253, of 17 or larger, and preferably 30 or larger), as a more specific concept of the light emitting device according to the second aspect of the first invention. Besides the silicone resin, a urethane-base elastomer (rubber) for example can also be used, provided that it satisfies the condition of a type-A durometric hardness of 50 or smaller.

For another case of the first configuration of the light emitting device according to the first invention, that is, for the case where the exterior of the soft first molding layer is covered with the hard second molding layer typically composed of an epoxy resin, it is also allowable to set a still smaller value for the lower limit value of the hardness of the first molding layer, and to thereby configure the first molding layer using a resin having a hardness of smaller than a type-A durometric hardness of 17. For example, hardness of a gel-type silicone resin cannot be measured by a type-A durometer, needing another method of specifying the hardness. More specifically, penetration measured by the consistency test method specified by JIS:K2220, using ¼ conical needle under a load of 9.38 g, can be used as an index for the hardness. The gel-type silicone resin is applicable if it has a penetration of, for example, 50 to 80, the smaller end inclusive (the range is far smaller than a type-A durometric hardness of 17). For the case where the first molding layer is composed of a still softer material as described in the above, coverage of the exterior thereof with the hard second molding layer, such as being composed of an epoxy resin, makes it possible to ensure strength and durability necessary for the mold. Coverage of the section reducing portion with a still softer resin is successful in improving an effect of absorbing the expansion-induced displacement, and also successful in improving the air-tightness of the mold, because the first molding layer can readily comply the geometry and can fill a gap unnecessarily formed between the first and second molding layers, typically due to shrinkage during curing of the second molding layer typically composed of an epoxy resin.

Commercially available silicone resins (for JCR) applicable to the first invention can be exemplified by gel-type ones such as KJR-9010 (penetration: 65), KJR-9015 (penetration: 65), KJR-9016 (penetration: 70) and KJR-9017 (penetration: 65), wherein these are trade names of Shin-Etsu Chemical Co., Ltd., and silicone elastomers such as KJR-9022 (type-A durometric hardness: 17), KJR-9023 (type-A durometric hardness; 22), KJR-9025 (type-A durometric hardness: 42), KJR-9030 and X-35-233-2, wherein these are trade names of Shin-Etsu Chemical Co., Ltd. All of these materials are those respectively having a type-A durometric hardness of 50 or smaller.

For the case where an Ag paste layer is formed, in the light emitting device of the first invention, as the electro-conductive adhesive layer so as to run off around the periphery of the second main surface of the device chip, the run-off surface of the Ag paste layer can configure a paste reflective surface, and is contributive to improvement in the reflectivity of the emission flux. In this case, the paste reflective surface is preferably covered with the polymer molding material composed of a silicone resin. The silicone resin, having better moisture shut-off property than that of epoxy resins or the like, can more effectively suppress moisture permeation to reach the paste reflective surface, can consequently suppress degradation of the paste reflective surface ascribable thereto, and can keep a more desirable reflectivity for a long duration of time, as compared with a conventional configuration in which the paste reflective surface is covered with an epoxy resin mold.

The light emitting device of the first invention can be configured so that the device chip comprises a main compound semiconductor layer having a light emitting layer portion and a main light extraction surface formed on the first main surface side thereof; and a electro-conductive base semiconductor layer disposed on the second main surface side of the main compound semiconductor layer, the second main surface of the base semiconductor layer being adhered to the metal stage while placing an electro-conductive adhesive layer in between; and the base semiconductor layer has a cut-off portion formed therein, so that at least a portion thereof right under the main light extraction surface is aimed to be cut off, so that a residual portion produced as a result of cutting off contains at least a portion thereof right under a main light extraction electrode, and so that at least the bottom surface of the cut-off portion configures the section reducing portion.

The above-described configuration, having the base semiconductor layer cut off at a portion which falls just under the main light extraction surface out of the second main surface of the main compound semiconductor layer, is successful in more effectively extracting the emission flux directed to such portion, and consequently in increasing the light extraction efficiency to a large degree. Because the cut-off portion in the first invention is filled with the soft polymer molding material as described in the above, any accidental expansion of thus-filled polymer molding material results in only a small level of stress generation, so that any nonconformity such as lifting-up and separation of the device chip from the electro-conductive adhesive layer can effectively be suppressed.

In this case, the base semiconductor layer can be formed as having a section increasing portion in which the sectional area normal to the thickness-wise direction continuously or stepwisely increases from a position at least in the midway of the thickness-wise direction towards the second main surface side thereof faced to the metal stage for adhesion. Provision of such section increasing portion on the second main surface side of the base semiconductor layer allows the stress induced by expansion of the polymer molding material in the cut-off portion to act in the section increasing portion in the direction of pressing the base semiconductor layer towards the electro-conductive adhesive layer, and makes it possible to more effectively suppress nonconformity such as lifting-up and separation of the device chip from the electro-conductive adhesive layer.

In this case, the light emitting device can be configured so that the base semiconductor layer is formed as having a recessed curved sectional geometry on the side face thereof in the cut-off portion, and so that a portion thereof located more closer to the second main surface side as viewed from a position of the bottom of the curved side face in the thickness-wise direction forms the section increasing portion. Provision of the base semiconductor layer as having the recessed curved sectional geometry on the side face thereof makes it possible to diffuse the expansion-induced stress of the molding material filled in the cut-off portion, in various directions along the curved surface, and makes the device chip further less likely to cause separation. This also raises a geometrical advantage in that the recessed curved sectional geometry can be obtained in a relatively easy manner, by chemically etching the side face of the base semiconductor layer, making use of a dicing groove formed when the wafer is separated into the individual device chips.

An outwardly-projecting, flange-like projected portion may be formed on the side face of the base semiconductor layer, at the end position on the second main surface side in the thickness-wise direction, so as to compose at least a portion of the section increasing portion. Provision of such flange-like projected portion can dimensionally increase area of the section increasing portion, can further improve an effect of pressurizing the base semiconductor layer against the electro-conductive adhesive layer when the expansion-induced stress is applied by the molding material, and can thereby make the device chip further less likely to cause separation. The flange-like projected portion also increases the area for adhesion to the metal stage, and consequently raises the adhesion strength.

The light emitting device of the first invention can be configured also as described below. That is, the main compound semiconductor layer is epitaxially grown on the first main surface of a light-absorptive compound semiconductor substrate, wherein a partial region of the first main surface of the main compound semiconductor layer is used as a main light extraction surface, and a light extraction side electrode through which operation voltage for emission is applied to the light emitting layer portion, is formed so as to cover a portion of the first main surface of the main compound semiconductor layer. The light-absorptive compound semiconductor substrate has the cut-off portion formed therein, so that at least a portion thereof right under the main light extraction surface is aimed to be cut off so that a residual substrate portion produced as a result of cutting off contains at least a portion thereof right under the main light extraction electrode, and so that at least the residual substrate portion forms the base semiconductor layer. For an exemplary case where the light emitting layer portion is composed of AlGaInP, an GaAs substrate may be used for the light-absorptive compound semiconductor substrate (and is finally the residual substrate portion) on which the light emitting layer portion is grown.

The light-absorptive compound semiconductor substrate in the above configuration is aimed to be cut off only in at least a portion thereof right under the main light extraction surface, and is cut off so that a residual substrate portion produced as a result of cutting off contains at least a portion thereof right under the main light extraction electrode, rather than removing the entire portion of the light-absorptive compound semiconductor substrate used for epitaxial growth of the light emitting layer portion (included in the main compound semiconductor layer), after growth of the light emitting layer portion. Cutting off of the compound semiconductor substrate used for the growth, capable of functioning as a light absorbing component, in the region which falls right under the main light extraction surface out of the second main surface of the main compound semiconductor layer, makes it possible to extract also emission flux directed to that region to the external, and to thereby raise the light extraction efficiency to a considerable degree. On the other hand, a portion of the substrate is remained unremoved as the residual substrate portion, at the region right under the light extraction side electrode. The residual substrate portion functions as a light absorber, but residence of a portion of the substrate in that region causes no substantial influences, because the reflected light, even occurs at the region right under the light extraction side electrode, is finally intercepted by such light extraction side electrode. By leaving a portion of the light-absorptive compound semiconductor substrate unremoved as the residual substrate portion in that region, it is therefore made possible to functionalize the residual substrate portion to add rigidity to the light emitting layer portion, without making the influence of light absorption by the residual substrate portion so distinctive.

The cut-off portion is more successful in increasing the energy of emission flux extractable making use thereof, if the cut-off portion is formed so as to surround the region right under the light extraction side electrode. The energy of emission flux extractable from the bottom surface of the cut-off portion can further be increased, by providing an auxiliary current spreading layer composed of a compound semiconductor, between the residual substrate portion and the light emitting layer portion. When the cut-off portion is formed, a portion of the light-absorptive compound semiconductor substrate may remain at the bottom of the cut-off portion, so far as the thickness of the remained portion is small enough (20 nm or smaller, for example). In view of improving the reflectivity as possible, it is however more preferable not to leave as possible the substrate-derived, light-absorptive compound semiconductor on the bottom of the cut-off portion. In other words, it is more preferable to form the cut-off portion so as to penetrate the light-absorptive compound semiconductor substrate in the thickness-wise direction thereof, and so as to allow the second main surface of the main compound semiconductor layer (having a light absorptivity smaller than that of the substrate) to expose in the cut-off portion.

The cut-off portion can be used as a space for housing a metal paste which tends to creep up onto the side face of the main compound semiconductor layer, when the base semiconductor layer is adhered using the electro-conductive adhesive layer. As a consequence, any nonconformity such as short-circuiting of p-n junction in the light emitting layer portion contained in the main compound semiconductor layer, due to crept-up metal paste, can effectively be prevented. In this case, the residual substrate portion ensured to as thick as 40 μm is successful in making the above-described effect more distinctive.

On the other hand, the device chip may be configured so that the side face thereof is formed as an inclined surface, at least in a portion in the thickness-wise direction thereof from the first main surface towards the second main surface, so as to continuously reduce the sectional area. Formation of such inclined surface makes it possible to increase the area of the side face of the device chip, and to thereby improve the light extraction efficiency. Furthermore, coverage of the inclined surface with a reflective metal layer makes it possible to reflect the emission flux from the light emitting layer portion back to the main light extraction surface side, to thereby improve the directivity of the emission flux towards that side. Because the inclined surface forms the above-described section reducing portion, effective suppression of separation of the device chip from the electro-conductive adhesive layer, for example, can be obtained, if the first molding layer is formed so as to cover the inclined surface.

For the case where the second molding layer is composed of a material having a refractive index larger than that of the first molding layer, and smaller than that of the compound semiconductor composing the main compound semiconductor layer, further improvement in the light extraction efficiency from the main light extraction surface can be obtained in any of the above-described configurations, by disposing the second molding layer in direct contact with the main light extraction surface of the main compound semiconductor layer.

(Second Invention)

A light emitting device according to the second invention is configured:

so that a device chip, having a main compound semiconductor layer having therein a light emitting layer portion and a main light extraction surface formed on the first main surface thereof, and a light-absorptive base semiconductor layer disposed on the second main surface side of the main compound semiconductor layer, is adhered on the second main surface of the base semiconductor layer thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion;

so that the base semiconductor layer has a cut-off portion formed therein, so that at least a portion thereof right under the main light extraction surface is aimed to be cut off, and so that a residual portion produced as a result of cutting off contains at least a portion thereof right under a light extraction side electrode; and so that the second main surface of the base semiconductor layer having the cut-off portion formed therein is adhered to a metal stage while placing an electro-conductive adhesive layer in between, and the device chip in this state is covered with a molding component so that the cut-off portion is filled with a polymer molding material, wherein the base semiconductor layer has a section increasing portion in which the sectional area normal to the thickness-wise direction increases from a position at least in the midway of the thickness-wise direction towards the second main surface side thereof faced to the metal stage for adhesion.

In the light emitting device of the second invention, the second main surface of the light-absorptive base semiconductor layer is adhered to the metal stage while placing the electro-conductive adhesive layer in between, and the device chip is covered with the molding component together with the electro-conductive adhesive layer. Cutting off of the base semiconductor layer in the region which falls right under the main light extraction surface out of the second main surface of the main compound semiconductor layer makes it possible to extract emission flux directed to that region in a more efficient manner, and to thereby raise the light extraction efficiency to a considerable degree. The cut-off portion is filled with the polymer molding material, wherein provision of the section increasing portion on the second main surface side of the base semiconductor layer makes it possible to allow the expansion-induced stress, caused by expansion of the polymer molding material filling the cut-off portion, to act in the section increasing portion in the direction of pressing the base semiconductor layer towards the electro-conductive adhesive layer, and makes it possible to more effectively suppress nonconformity such as lifting-up and separation of the device chip from the electro-conductive adhesive layer. The section increasing portion may be either such as having the sectional area, normal to the thickness-wise direction, increasing in a continuous manner, or in a step-wide manner.

The molding component may be configured in at least a portion thereof using an epoxy resin. The epoxy resin has a relatively large refractive index, and can therefore give a particularly distinctive effect of improving the light extraction efficiency, but is likely to cause nonconformity such as separation of the device chip as described in the above, due to its large thermal expansion coefficient. Whereas, the second invention makes it possible to enjoy an effect of improving the light extraction efficiency without any problems, while suppressing the nonconformity such as separation of the device chip, even when the epoxy resin having a large thermal expansion coefficient is used as the molding material. Adoption of a configuration having the cut-off portion filled with the epoxy resin can promise a particularly distinctive effect. The molding portion may be composed of the epoxy resin over the entire portion thereof, or only in a portion thereof.

In the second invention, the light emitting device may be configured so that the base semiconductor layer is formed so as to have a recessed curved sectional geometry on the side face thereof in the cut-off portion, and so that a portion thereof located more closer to the second main surface side as viewed from a position of the bottom of the curved side face in the thickness-wise direction forms the section increasing portion. By configuring the base semiconductor layer so as to have a recessed curved sectional geometry on the side face thereof, the expansion-induced stress of the molding material filled in the cut-off portion can be diffused, in various directions along the curved surface, and the device chip is made further less likely to cause separation. This also raises a geometrical advantage in that the recessed curved sectional geometry can be obtained in a relatively easy manner, by chemically etching the side face of the base semiconductor layer, making use of a dicing groove formed when the wafer is separated into the individual device chips An outwardly-projecting, flange-like projected portion may also be formed on the side face of the base semiconductor layer, at the end position on the second main surface side in the thickness-wise direction thereof, so as to compose at least a portion of the section increasing portion. Provision of such flange-like projected portion can dimensionally increase area of the section increasing portion, can further improve an effect of pressurizing the base semiconductor layer against the electro-conductive adhesive layer when the expansion-induced stress is applied by the molding material, and can thereby make the device chip further less likely to cause separation. The flange-like projected portion also increases the area for adhesion to the metal stage, and consequently raises the adhesion strength.

The light emitting device of the second invention can be configured also as described below. That is, the main compound semiconductor layer is epitaxially grown on the first main surface of a light-absorptive compound semiconductor substrate, wherein a partial region of the first main surface of the main compound semiconductor layer is used as a main light extraction surface, and a light extraction side electrode through which operation voltage for emission is applied to the light emitting layer portion is formed so as to cover a portion of the first main surface of the main compound semiconductor layer. The light-absorptive compound semiconductor substrate has the cut-off portion formed therein, so that at least a portion thereof right under the main light extraction surface is aimed to be cut off, so that a residual substrate portion produced as a result of cutting off contains at least a portion thereof right under the main light extraction electrode, and so that at least the residual substrate portion forms the base semiconductor layer. For an exemplary case where the light emitting layer portion is composed of AlGaInP, an GaAs substrate may be used for the light-absorptive compound semiconductor substrate (and is finally the residual substrate portion) on which the light emitting layer portion is epitaxially grown.

The light-absorptive compound semiconductor substrate in the above configuration is aimed to be cut off only in at least a portion thereof right under the main light extraction surface, and is cut off so that a residual substrate portion produced as a result of cutting off contains at least a portion thereof right under the main light extraction electrode, rather than removing the entire portion of the light-absorptive compound semiconductor substrate used for epitaxial growth of the light emitting layer portion (included in the main compound semiconductor layer), after growth of the light emitting layer portion. Cutting off of the compound semiconductor substrate used for the growth, capable of functioning as a light absorbing component, in the region which falls right under the main light extraction surface out of the second main surface of the main compound semiconductor layer makes it possible to extract also emission flux directed to that region to the external, and to thereby raise the light extraction efficiency to a considerable degree. On the other hand, a portion of the substrate is remained unremoved as the residual substrate portion, at the region right under the light extraction side electrode. The residual substrate portion functions as a light absorber, but residence of a portion of the substrate in that region causes no substantial influences, because the reflected light, even occurs at the region right under the light extraction side electrode, is finally intercepted by such light extraction side electrode. By leaving a portion of the light-absorptive compound semiconductor substrate unremoved as the residual substrate portion in that region, it is therefore made possible to functionalize the residual substrate portion to add rigidity to the light emitting layer portion, without making the influence of light absorption by the residual substrate portion so distinctive.

The cut-off portion is more successful in increasing the energy of emission flux extractable making use thereof, if the cut-off portion is formed so as to surround the region right under the light extraction side electrode. The energy of emission flux extractable from the bottom surface of the cut-off portion can further be increased, by providing an auxiliary current spreading layer composed of a compound semiconductor, between the residual substrate portion and the light emitting layer portion. When the cut-off portion is formed, a portion of the light-absorptive compound semiconductor substrate may remain at the bottom of the cut-off portion, so far as the thickness of the remained portion is small enough (20 nm or smaller, for example). In view of improving the reflectivity as possible, it is however more preferable not to leave as possible the substrate-derived, light-absorptive compound semiconductor on the bottom of the cut-off portion. In other words, it is more preferable to form the cut-off portion so as to penetrate the light-absorptive compound semiconductor substrate in the thickness-wise direction thereof, and so as to allow the second main surface of the main compound semiconductor layer (having a light absorptivity smaller than that of the substrate) to expose in the cut-off portion.

The cut-off portion can be used as a space for housing a metal paste which tends to creep up onto the side face of the main compound semiconductor layer, when the base semiconductor layer is adhered using the electro-conductive adhesive layer. As a consequence, any nonconformity such as short-circuiting of p-n junction in the light emitting layer portion contained in the main compound semiconductor layer, due to crept-up metal paste, can effectively be prevented. In this case, the residual substrate portion ensured to as thick as 40 μm is successful in making the above-described effect more distinctive.

BRIEF DESCRIPTION OF THE DRAWINGS

FIG. 14 is a drawing explaining a state of occurring of separation in the device chip due to expansion of the molding component.

BEST MODES FOR CARRYING OUT THE INVENTION (First Invention)

Figure 1:
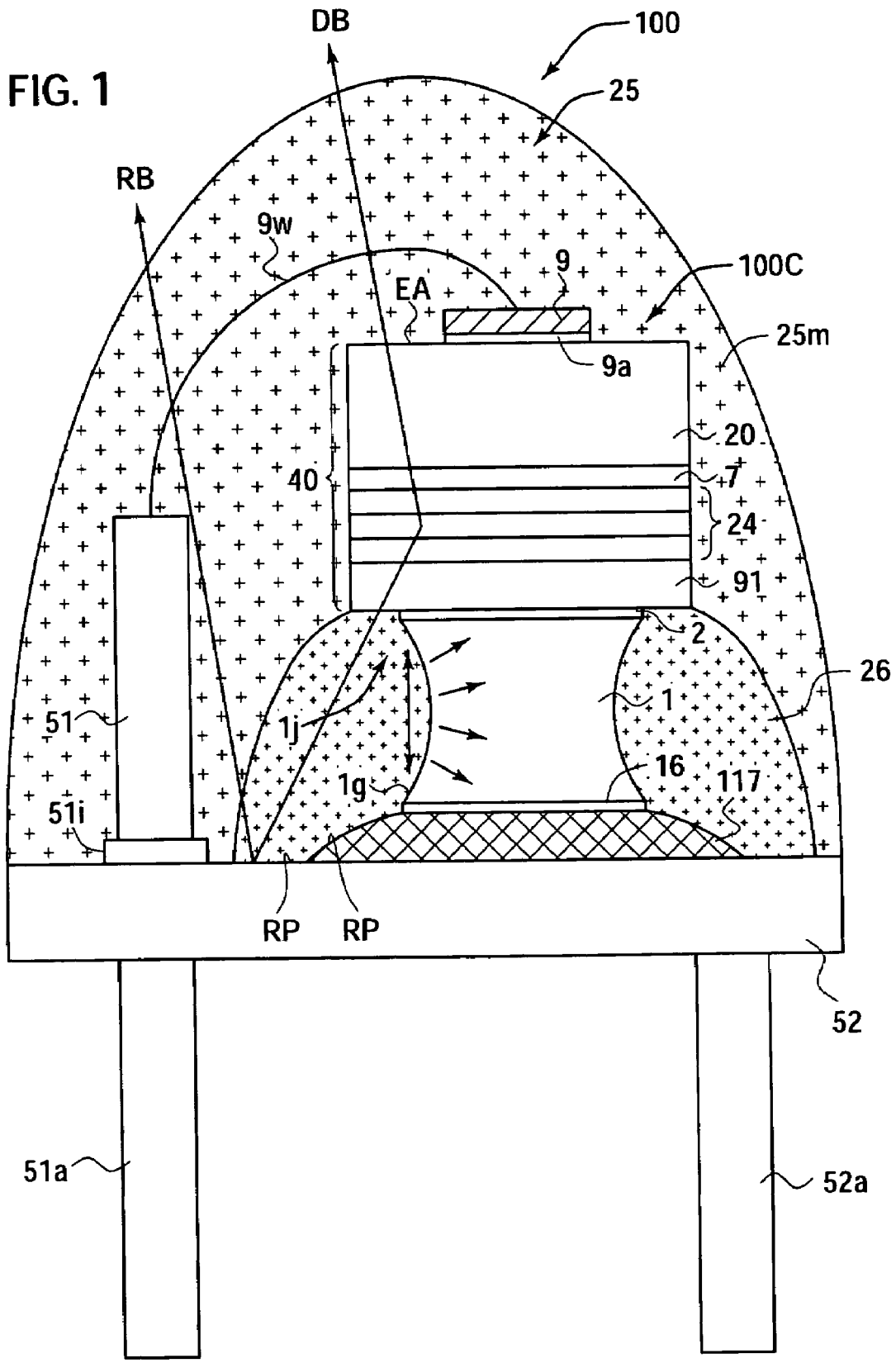
FIG. 1 is a schematic sectional view showing an example of the light emitting device of the first invention.
Figure 2:
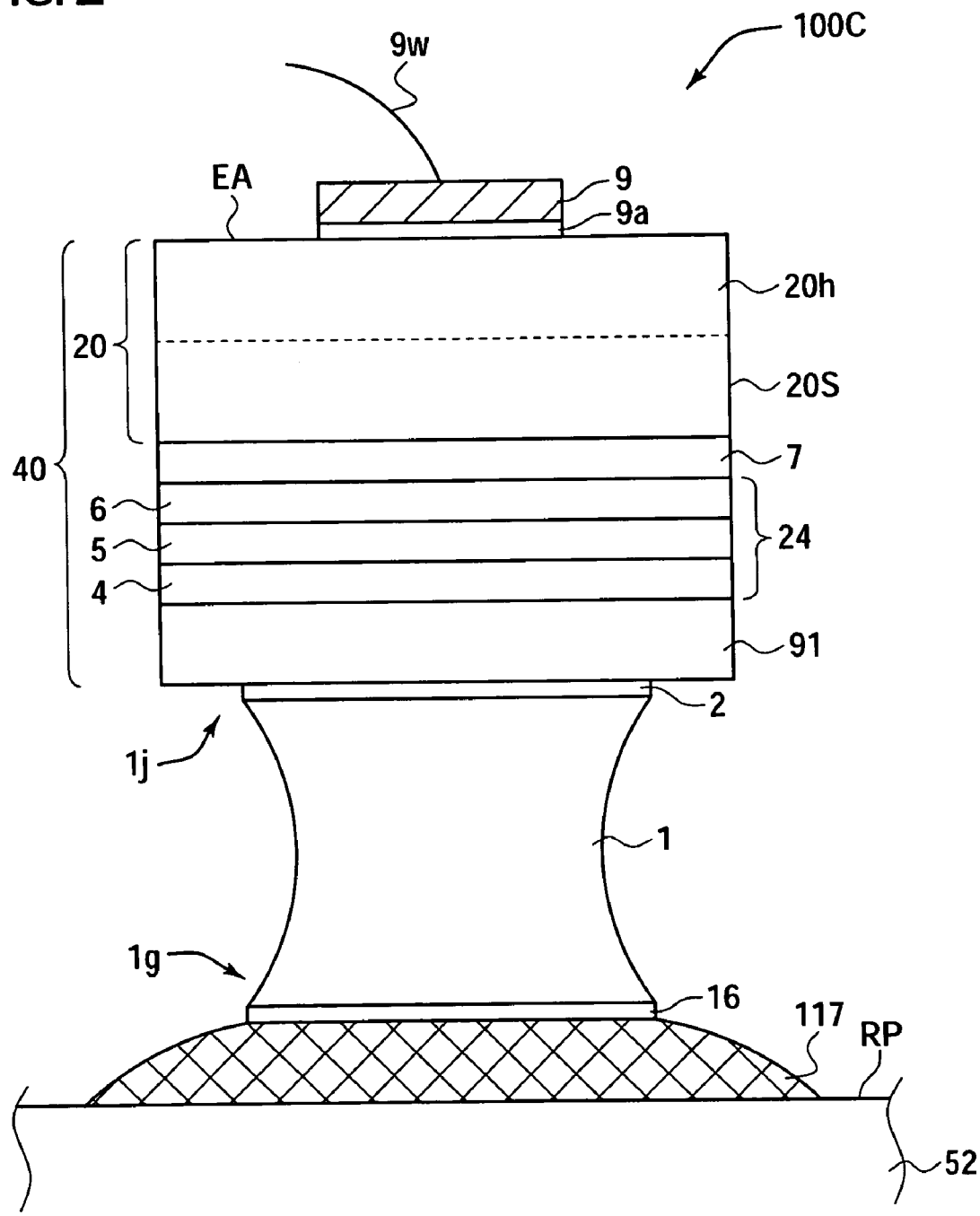
FIG. 2 is an enlarged schematic sectional view of the device chip shown in FIG. 1.

Paragraphs below will explain best modes for carrying out the first invention, referring to the attached drawings. A light emitting device 100 shown in FIG. 1 has a device chip 100C in which a main compound semiconductor layer 40 having a light emitting layer portion 24 is epitaxially grown on a first main surface of a light-absorptive compound semiconductor substrate (see FIG. 3 reference numeral 10). FIG. 2 is an enlarged view of the device chip 100C, showing that a main light extraction surface EA is formed on the first main surface side of the main compound semiconductor layer 40, and that a light extraction side electrode 9 applying therethrough operation voltage for emission to the light emitting layer portion 24 is formed so as to cover a part of the first main surface of the main compound semiconductor layer 40 (more specifically, the residual region of the main light extraction surface EA). The light-absorptive compound semiconductor substrate 10 shown in FIG. 3 has, as shown in FIG. 1, a cut-off portion 1j formed by cutting off the circumferential portion thereof other than the portion right under the light extraction side electrode, leaving the portion of the substrate along the cut-off portion. 1j as a residual substrate portion (base semiconductor layer) 1. As shown in FIG. 1, a transparent thick semiconductor layer 20, a connection layer 7, the light emitting layer portion 24 and an auxiliary current spreading layer 91 belong to the main compound semiconductor layer 40, and a buffer layer 2 and a residual substrate portion 1 do not belong to the main compound semiconductor layer 40.

The light emitting layer portion 24 has a structure in which, as shown in FIG. 2 in an enlarged manner, an active layer 5 composed of a non-doped $(Al_xGa_{1-x})_yIn_{1-y}P$ alloy (where, $0 \leq x \leq 0.55$, $0.45 \leq y \leq 0.55$) is held between a p-type cladding layer 6 composed of a p-type $(Al_zGa_{1-z})_yIn_{1-y}P$ alloy (where, $x<z\leq 1$) and an n-type cladding layer 4 composed of an n-type $(Al_zGa_{1-z})_yIn_{1-y}P$ alloy (where, $x<z\leq 1$), allowing adjustment of the emission wavelength over a range from green to red regions (550 nm to 670 nm, both ends inclusive, on the basis of emission wavelength (peak emission wavelength)), depending on composition of the active layer 5. In the light emitting device 100 shown in FIG. 1, the n-type AlGaInP cladding layer 4 is disposed on the light extraction side electrode 9 and the p-type AlGaInP cladding layer 6 is disposed on the residual substrate portion 1. Thus the electrode polarity is positive on the light extraction side electrode. e noted that "non-doped" in the context herein means "not intentionally added with a dopant", and never excludes possibility of any dopant components inevitably included in the normal. fabrication process (up to $1\times10^{13}$ to $1\times10^{16}/cm^3$ or around, for example). The residual substrate portion comprises of GaAs single crystal.

In the main compound semiconductor layer 40, the transparent thick semiconductor layer 20 composed of GaP (or may be GaAsP or AlGaAs) is formed on the first main surface of the light emitting layer portion 24, and the above-descried light extraction side electrode 9 (Au electrode, for example) is formed at the near center of the first main surface of the transparent thick semiconductor layer 20. The region around the light extraction side electrode 9 of the first main surface of the transparent thick semiconductor layer 20 forms the main light extraction surface EA. In this embodiment, the surficial portion of the transparent thick semiconductor layer 20 on the light extraction side electrode 9 side is configured by a high concentration doped layer 20h having the dopant concentration raised than in the residual portion, for the purpose of further lowering the contact resistance with the light extraction side electrode 9, and of enhancing the in-plane current spreading effect. The transparent thick semiconductor layer 20, formed typically to be as thick as 10 μm to 200 μm, both ends inclusive (more preferably 40 μm to 200 μm, both ends inclusive), also takes part in increasing the flux extractable through the side face 20S, and in raising the luminance (integrating sphere luminance) of the entire light emitting device. The transparent thick semiconductor layer 20 is also successfully suppressed in absorption of the emitted flux of light, by being composed of a III-V compound semiconductor having a band gap energy larger than photon energy correspondent to the peak wavelength of the flux of light emitted from the light emitting layer portion 24. Between the light extraction side electrode 9 and the transparent thick semiconductor layer 20, there is formed a contact alloy layer 9a aimed at reducing the contact resistance therebetween, using an AuBe alloy for example.

On the other hand, on the residual substrate 1 side, there is formed the cut-off portion 1j so as to penetrate the residual substrate portion 1 in the thickness-wise direction thereof, allowing the second main surface of the main compound semiconductor layer 40, being a part of the second main surface of the auxiliary current spreading layer 91 herein, to expose in the cut-off portion 1j (the exposed surface composes the bottom of the cut-off portion 1j). The light-absorptive compound semiconductor substrate, and consequently the residual substrate portion 1 in this embodiment, is configured as having an n-type conductivity.

In this embodiment, the light emitting device is configured so that the emission flux from the light emitting layer portion 24 is extractable also through the cut-off portion 1j. More specifically, the second main surface of the residual substrate portion 1 is adhered to a metal stage 52 which also functions as a reflective component, so as to allow the emission flux extracted through the cut-off portion 1j to be reflected on the reflective surface RP of the metal stage 52. Over the entire portion of the second main surface of the residual substrate portion 1, there is formed a contact alloy layer 16 so as to compose the back electrode portion. The contact alloy layer 16 is obtained by forming a film of a contact metal containing Au or Ag as a major component (50% by mass or more), as being compounded with an appropriate amount of alloy components necessary for ensuring ohmic contact with a semiconductor to be contacted, depending on species and conductivity type of such semiconductor, and by subjecting the film to annealing for alloying (so called sintering). The contact alloy layer 16 in this embodiment is formed using an AuGeNi alloy (Ge: 15% by mass, Ni: 10% by mass and the balance of Au, for example).

As shown in FIG. 1, the residual substrate portion 1 is adhered, on the contact alloy layer 16 side, to the reflective surface RP of the metal stage 52, while placing the metal paste layer 117 (electro-conductive adhesive layer) in between. The light emitting layer portion 24 is thus electrically connected to the metal stage 52, using the residual substrate portion 1 as a conduction path, via the metal paste layer 117. The metal paste layer 117 is formed by coating and drying a metal paste having a metal powder such as Ag powder diffused in the vehicle thereof composed of a binder resin and a solvent. On the other hand, the light extraction side electrode 9 is electrically connected to a conductor metal fitting 51 through a bonding wire 9w composed of an Au wire or the like. The conductor metal fitting 51 penetrates the metal stage 52 and extends towards the back side, to thereby form a first current supply terminal 51a. On the other hand, a second current supply terminal 52a is formed so as to run off around the back surface of the metal stage 52. Between the conductor metal fitting 51 and the metal stage 52, there is disposed a resin-made insulating ring 51i. The light emitting layer portion 24 is applied with operation voltage for emission through the first current supply terminal 51a and the second current supply terminal 52a.

On the metal stage 52, the device chip 100C, together with the metal paste layer 117, is covered with a molding component 25 composed of a polymer molding material having transparency to the emission flux from the light emitting layer portion 24; The molding component 25 is formed so that the polymer molding material fills the cut-off portion 1j of the device chip 100C. The sectional area of the device chip 100C normal to the thickness-wise direction thereof is step-wisely decreased by the bottom surface of the cut-off portion 1j (exposed portion of the second main surface of the main compound semiconductor layer 40), from the first main surface side towards the second main surface side. In other words, the bottom surface of the cut-off portion 1j forms the section reducing portion. In the molding component 25, a first molding layer 26 composed of a silicon resin for JCR (for example, the above-described KJR-9010 as a gel-type silicone resin) is formed so as to fill the cut-off portion 1j, and a second molding layer 25m composed of an epoxy resin is formed so as to cover the first molding layer 26. The first molding layer 26 is softer than the second molding layer 25m. The second molding layer 25m having a large refractive index is disposed in direct contact with the side face and the first main surface, composing the main light extraction surface, of the main compound semiconductor layer 40, so as to raise the light extraction efficiency from the side face and the main light extraction surface of the main compound semiconductor layer 40.

The residual substrate portion 1 has formed therein a section increasing portion 1g in which the sectional area normal to the thickness-wise direction continuously increases from a position in the midway of the thickness-wise direction thereof towards the second main surface side faced to the metal stage 52 for adhesion. More specifically, the residual substrate portion 1 is formed so as to have a recessed curved sectional geometry on the side face thereof in the cut-off portion 1j, and so that a portion thereof located more closer to the second main surface side as viewed from a position of the bottom of the curved side face in the thickness-wise direction forms the section increasing portion 19. On the other hand, a portion of the residual substrate portion 1 located more closer to the first main surface side as viewed from a position of the bottom of the curved side face forms the section decreasing portion, wherein this portion is covered with the soft first molding layer 26 together with the bottom of the cut-off portion 1j.

Between the residual substrate portion 1 and the light emitting layer portion 24, there is formed the auxiliary current spreading layer 91 composed of a compound semiconductor such as AlGaInP, AlGaAs, AlInP, or InGaP. The thickness of the auxiliary current spreading layer 91 is adjusted typically to 0.5 µm to 30 µm, both ends inclusive (more preferably 1 µm to 15 µm, both ends inclusive), raised in the effective carrier concentration (and therefore n-type dopant concentration) than the cladding layer closer thereto (n-type cladding layer 4 in this embodiment) in the light emitting layer portion 24, and consequently raised in the in-plane current spreading effect. Another possible way is to thicken the n-type cladding layer 4 than the p-type cladding layer 6, to thereby functionalize the surficial portion of the n-type cladding layer 4 on the second main surface side thereof as the auxiliary current spreading layer.

In the above-described configuration, the emission flux extracted from the bottom of the cut-off portion 1j is allowed to reflect on the reflective surface RP of the metal stage 52, and the resultant reflected flux RB makes it possible to distinctively increase the emission flux directed towards the first main surface side of the light emitting layer portion 24. The auxiliary current spreading layer 91 provided between the residual substrate portion 1 and the light emitting layer portion 24 enhances the current spreading effect towards the bottom portion of the cut-off portion 1j, and increases the current fraction supplied to the portion of the light emitting layer portion 24 corresponded to the cut-off portion 1j. The emission flux extractable through the bottom of the cut-off portion 1j can further be increased.

In a configuration shown in FIG. 14, wherein the residual substrate portion 1 has a simple upright outer circumference, and the entire portion of the molding component 25 is composed of a hard epoxy resin, the epoxy resin filled in the cut-off portion 1j may expand typically due to heat generated under current supply to the device chip 100C, and may produce a strong expansion-induced stress in a stretching manner between the bottom of the cut-off portion 1j (exposed outer circumferential surface of the auxiliary current spreading layer 91 in an illustrated case) and the top surface of the metal stage 51. Because there is no regulatory component against movement of the residual substrate portion 1 in the thickness-wise direction, such stretching force in this case undesirably results in lift-up of the device chip 100C as if being jacked up, and in separation from the metal paste layer 117 which configures an adhesive layer.

Whereas in the light emitting device 100 shown in FIG. 1, the cut-off portion 1j is filled with a soft silicone resin (polymer molding material) composing the first molding layer 26 which readily causes compressive deformation even if the thermal expansion should occur, and results in only a small level of stress generation. Provision of the section increasing portion 19 on the second main surface side of the residual substrate portion 1 allows the expansion-induced stress, produced under expansion of the silicone resin filled in the cut-off portion 1j, to pressurize the residual substrate portion 1, and consequently the device chip 100C, against the metal paste layer 117 (electro-conductive adhesive layer) in the section increasing portion 1g. This consequently makes it possible to suppress effectively nonconformity such that the device chip 100C floats up and separates from the metal paste layer 117 The side face of the residual substrate portion 1 formed so as to have a recessed curved sectional geometry is contributive to diffuse the expansion-induced stress of the silicone resin filled in the cut-off portion 1j into various directions along the curved surface, and typically makes the device chip 100C further less likely to separate. The first molding layer 26 shown in FIG. 1 is composed of a resin having a type-A durometric hardness of less than 17, more specifically a gel-type silicone resin, and is therefore further raised in the effect of absorbing the expansion-induced displacement. The first molding layer 26 can also improve the air-tightness of the molding component 25, because the first molding layer 26 can readily deform conforming, for example, shrinkage of the second molding layer 25m composed of an epoxy resin (polymer molding material) in the process of curing, so as to fill any unnecessary gap possibly produced between itself and the second molding layer 25m.

In this embodiment, the metal paste layer 117 composed of an Ag paste layer is formed so as to run off around the periphery of the second main surface of the device chip 100C, wherein the run-off surface of the Ag paste layer composes a paste reflective surface RP'. The first molding layer 26 composed of a silicone resin is formed so as to cover the paste reflective surface RP'. The silicone resin is superior in moisture shut-off property to the epoxy resin or the like composing the second molding layer 25m, so that the paste reflective surface RP' can be prevented from oxidative degradation due to permeated moisture reached thereto, and the reflectivity thereof can be maintained for a long period.

Paragraphs below will explain a method of fabricating the light emitting device 100 shown in FIG. 1.

Figure 3:
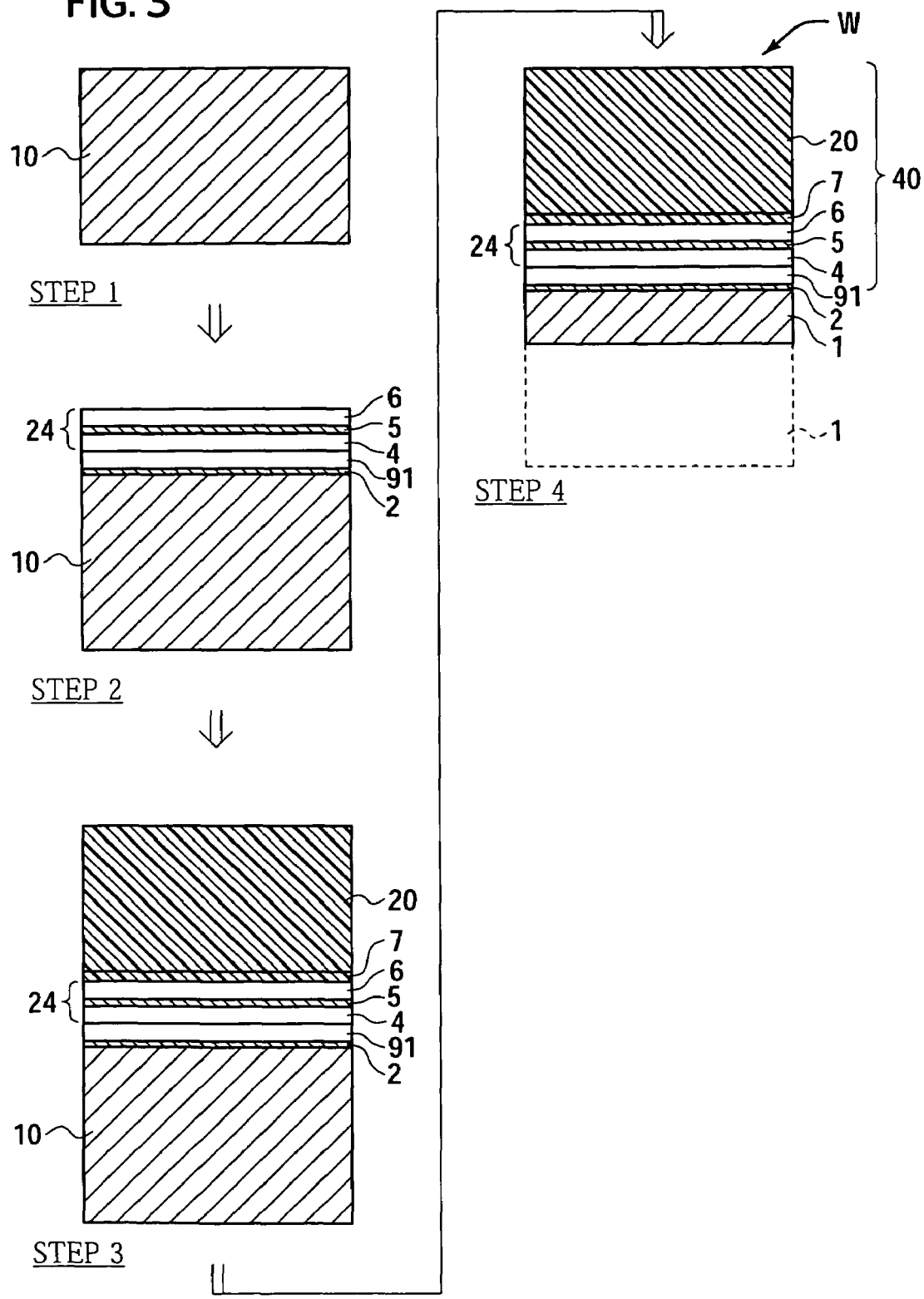
FIG. 3 is a drawing explaining a series of process steps of a method of fabricating the light emitting device shown in FIG. 1.

First, as shown in STEP 1 in FIG. 3, the growth substrate 10 composed of an n-type GaAs single crystal is obtained. Next, as shown in STEP 2, the buffer layer 2 is grown on the first main surface of the growth substrate 10, and the auxiliary current spreading layer 91 is grown further thereon. The n-type cladding layer 4, the active layer (non-doped) 5, and the p-type cladding layer 6 are epitaxially grown in this order by a publicly-known MOVPE (metal-organic vapor phase epitaxy) process, to thereby form the light emitting layer portion 24. The process then advances to STEP 3, wherein the transparent thick semiconductor layer 20 (having a thickness of 10 µm to 200 µm, both ends inclusive (typically 100 µm)) is epitaxially grown, typically by the HVPE (hydride vapor phase epitaxy) process or the MOVPE process. In particular, the transparent thick semiconductor layer 20 composed of GaP, GaAsP or AlGaAs is advantageous in that it can readily and rapidly be grown as a high quality film by the HVPE process, and in that it has only small contents of residual hydrogen and carbon. The transparent thick semiconductor layer 20 herein may be formed also by bonding a substrate composed of GaP, GaAsP or AlGaAs to the light emitting layer portion 24. In this case, the bonding can be carried out in a more exact manner, by preliminarily forming the connection layer 7 composed of AlInP, GaInP or AlGaAs succeeding to the light emitting layer portion 24, and by bonding the substrate composed of GaP, GaAsP or AlGaAs to the connection layer 7 The connection layer 7 is not specially required when the HVPE process is adopted.

The process then advances to STEP 4, wherein the growth substrate 10 is thinned. In this embodiment, a second main surface side portion 1" of the growth substrate 10 is removed by grinding, and the remained portion of the substrate is used as a substrate bulk 1'. A device wafer W having therein the substrate bulk 1" integrated onto the second main surface of the main compound semiconductor layer 40 is thus obtained.

Figure 4:
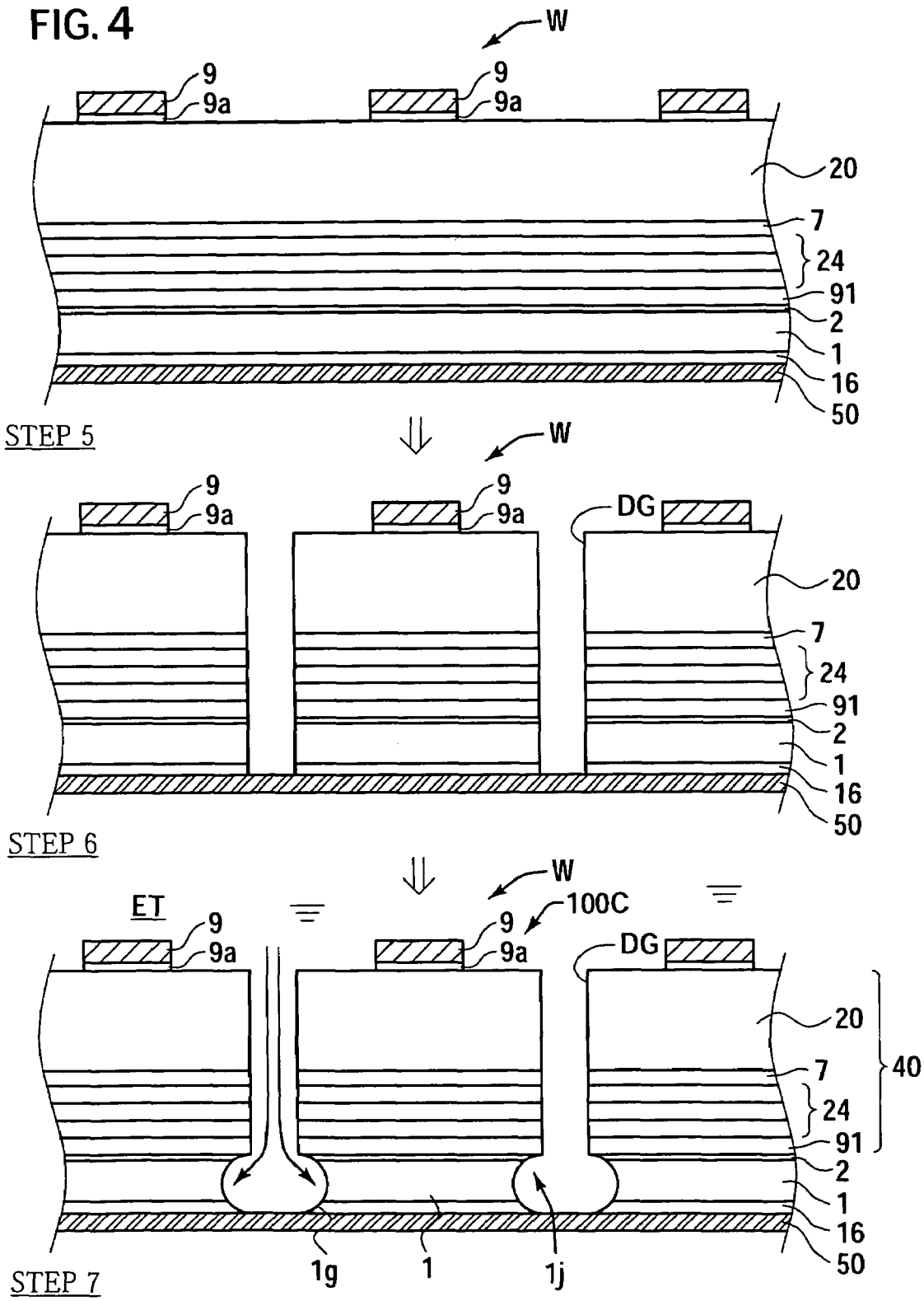
FIG. 4 is a drawing explaining process steps as continued from FIG. 3.

The process then advances to STEP 5 in FIG. 4, wherein a metal material layer forming the contact alloy layer is formed on the second main surface of the substrate bulk 1' of the device wafer W typically by vapor deposition, and the layer is then annealed for alloying in the temperature range from 350° C. to 500° C., both ends inclusive, to thereby form the contact alloy layer 16. A contact alloy layer 9a is similarly formed on the first main surface of the transparent thick semiconductor layer 20 (may be annealed for alloying at the same time with the contact alloy layer 16). The contact alloy layer 9a is covered, as shown in FIG. 1, with the light extraction side electrode 9 formed by vacuum evaporation of Au or the like. An auxiliary supporting sheet 50 for breaking, composed of a soft elastic material such as EVA (ethylene vinylacetate copolymer) is then bonded to the second main surface of the substrate bulk 1', and as shown in STEP 6, dicing grooves DG are formed so as to separate the device wafer W into the individual light emitting device chips by using a publicly-known dicer on the first main surface side of the wafer. The dicing grooves DG in this process may be formed so as to slightly dig the auxiliary supporting sheet 50, so far as the auxiliary supporting sheet 50 is not divided.

Next, as shown in STEP 7, the diced device wafer W is dipped in an etching solution ET (ammonia/hydrogen peroxide mixed solution, for example), having a selective etching property to GaAs. The etching solution ET permeate through the dicing grooves DG, and erodes the GaAs substrate bulk 1' and the GaAs buffer layer 2, exposed on the groove bottom side, from the side faces thereof The erosion of the substrate bulk 1' and the buffer layer 2 is less likely to proceed on the side more closer to the interface with main compound semiconductor layer 40 showing a small etchrate to the etching solution (the layer in contact with the GaAs buffer layer 2 herein is the auxiliary current spreading layer 91 composed of AlGaInP and so forth), and more likely to proceed as distanced from the interface. The etchrate, however, decreases again from midway of the depth towards the bottom of the groove, due to increased difficulty in exchange of the etching solution ET at deeper position in the groove, because the etching solution is supplied to the side face of the substrate bulk 1' through such narrow dicing groove DG. Another cause for the decreased etchrate at the deeper position in the bottom of the groove can be found in that the contact alloy layer 16 less likely to be eroded is formed at the bottom of the groove This results in erosion of the side faces of the substrate bulk 1' and the buffer layer 2 so as to have the recessed curved sectional geometry. The etching is allowed to proceed so that the erosion reaches a predetermined depth in the in-plane direction, and the device wafer W is taken out from the etching solution and washed, to thereby obtain the cut-off portion 1j having the side face with the recessed curved sectional geometry. The etchrate can be adjusted depending on the width of the dicing grooves DG, wherein the groove may also be widened, immediately after being formed by the dicer, by stretching to the in-plane direction and deforming the auxiliary supporting sheet 50, raising an advantage of reducing wafer loss due to dicing margin.

Figure 5:
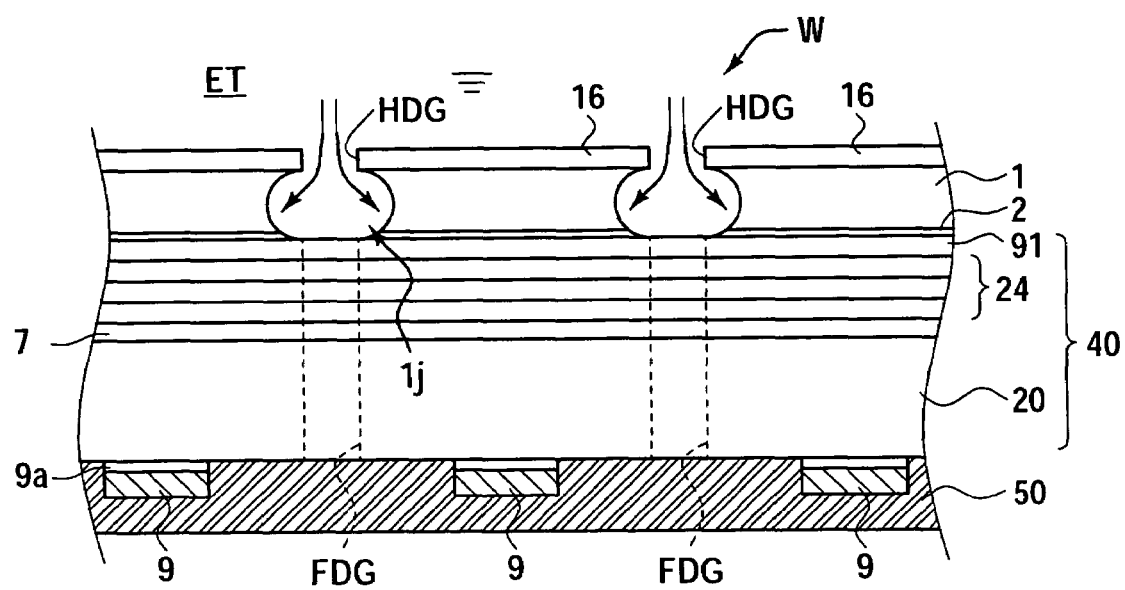
FIG. 5 is a drawing explaining another series of process steps of forming the cut-off portion having a recessed curved sectional geometry.

It is to be noted, as shown in FIG. 5, that half-diced grooves HDG may be formed from the second main surface side of the device wafer W, so as to penetrate the contact alloy layer 16 (electrode component) and the substrate bulk 1', wherein the process step is followed by etching so as to form the cut-off portion, having the recessed curved sectional geometry on the side face thereof. In this case, the formation of the cut-off portion 1*j* is followed by formation of full-diced grooves FDG in the residual main compound semiconductor layer 40, so as to extend the half-diced grooves HDG, and thereby the device wafer W is separated into the individual device chips.

Each of thus-separated device chips 100C is then adhered, on the second main surface side of the residual substrate portion 1, to the metal stage 52 using the metal paste layer 117 as shown in FIG. 1, and a silicone resin composing the first molding layer 26 is then used to coat around the base portion of the chip on the adhesion side so as to fill the cut-off portion 1*j*. The light extraction side electrode 9 is then connected to the conductor metal fitting 51 via a bonding wire 9*w* and the second molding layer 25*m* composed of an epoxy resin is further formed, to thereby complete the light emitting device 100.

Figure 6:
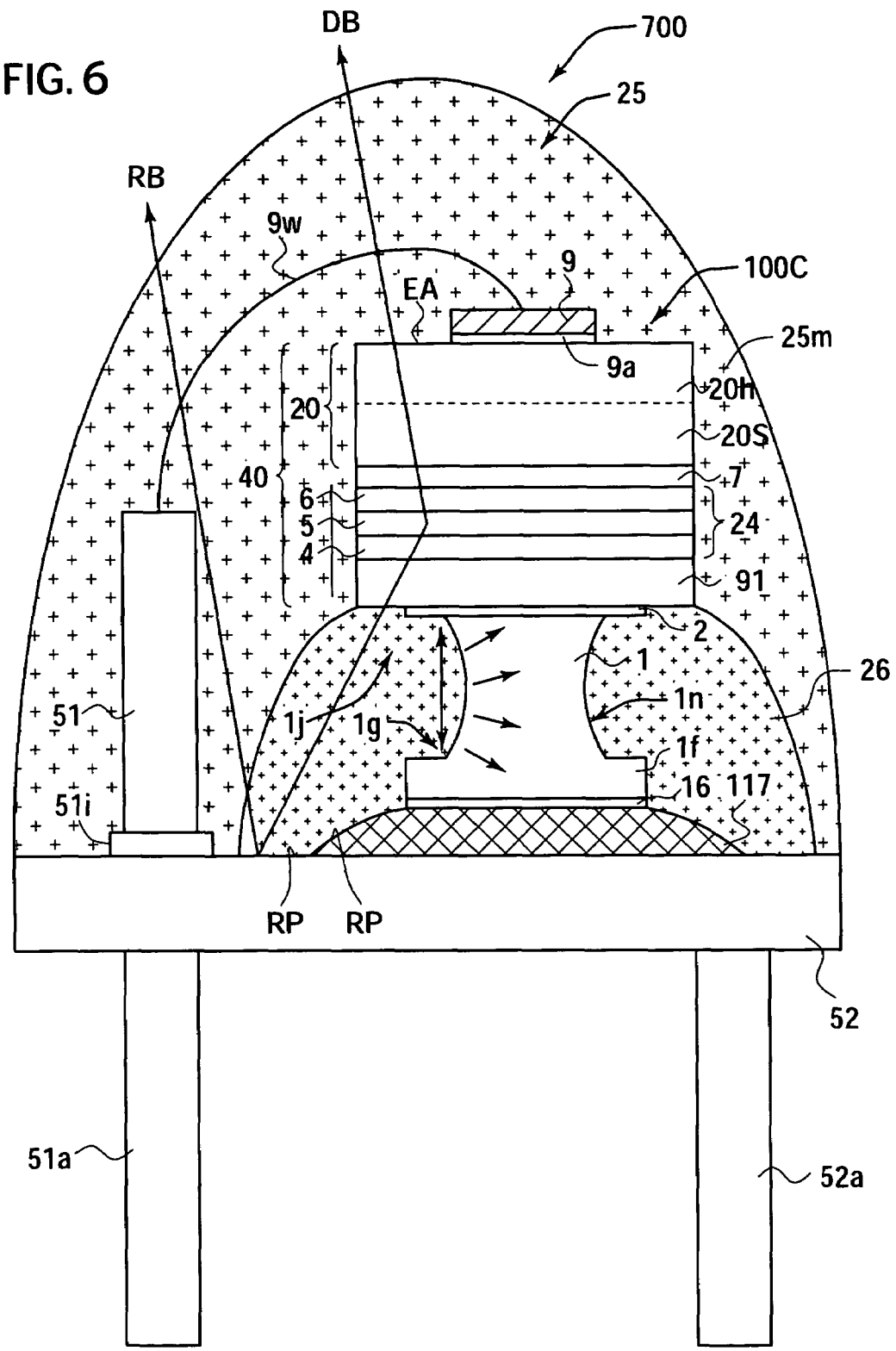
FIG. 6 is a schematic sectional view showing a first modified example of the light emitting device shown in FIG. 1.

On the side face of the residual substrate portion 1, at the end position thereof on the second main surface side in the thickness-wise direction, an outwardly-projecting, flange-like projected portion 1*f* may be formed so as to compose at least a portion of the section increasing portion 1*g*, as shown in a light emitting device 700 shown in FIG. 6. Formation of such flange-like projected portion If can dimensionally increase area of the section increasing portion 1*g* at the end position thereof on the second main surface side responsive to adhesion, and this makes the device chip 100C less likely to cause separation or the like. In this embodiment, the residual substrate portion 1 is configured so as to have the recessed curved sectional geometry on the side face of the bulk portion excluding the projected portion 1*f*, and also the end portion of such bulk portion in configures the section increasing portion 1*g* together with the projected portion 1*f*. The sectional area of the residual substrate portion 1 step-wisely increases at the boundary position between the bulk portion In and the projected portion 1*f*.

Figure 7:
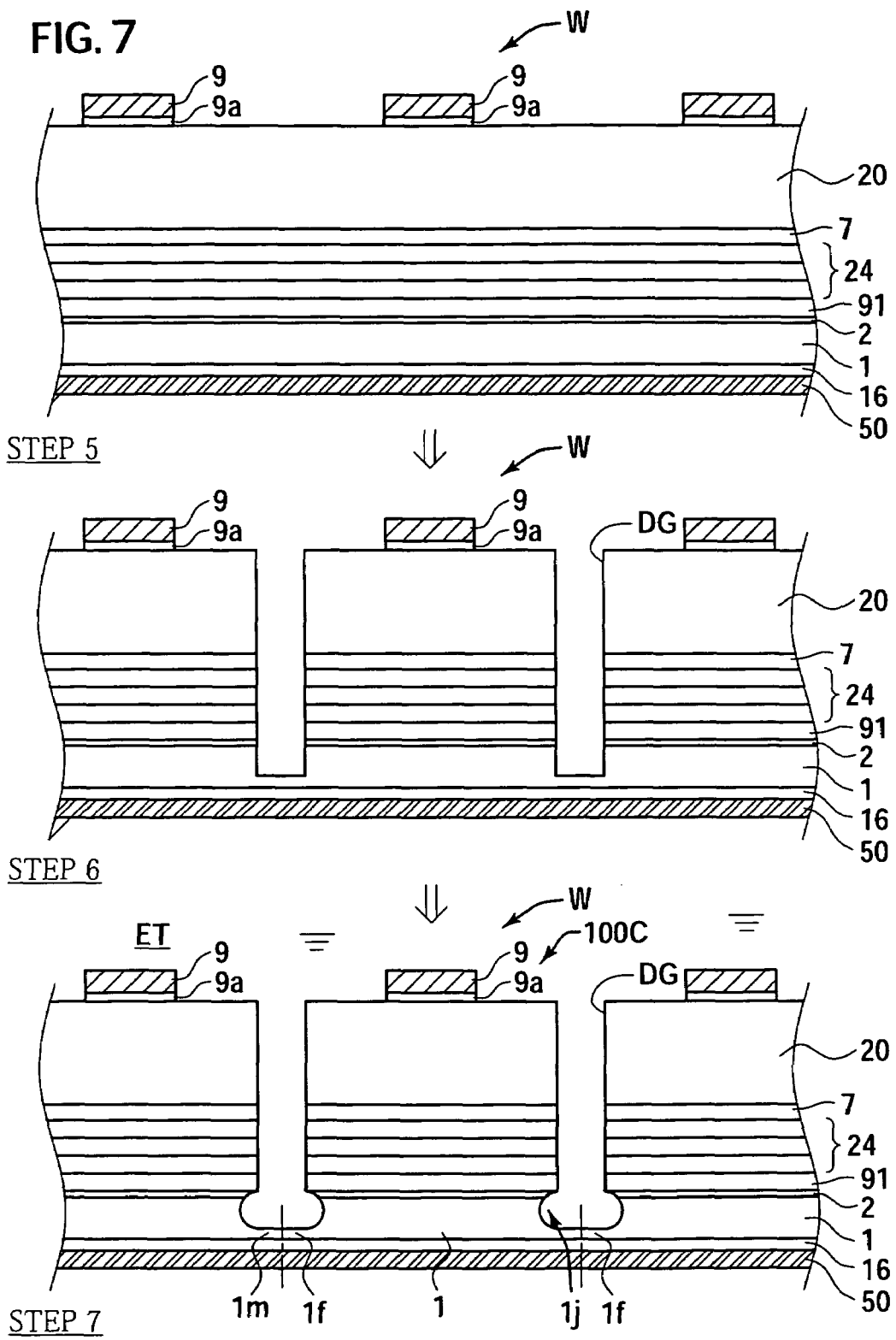
FIG. 7 is a drawing explaining process steps of a method of fabricating the light emitting device shown in FIG. 5.

The structure shown in FIG. 6 can be obtained by adopting the process steps shown in FIG. 7. STEP 5 is absolutely same as STEP 5 in FIG. 4. In STEP 6, the dicing grooves DG are formed. so as to leave a portion of the substrate bulk 1' unremoved at the bottom of the grooves, and the process step is followed by the similar etching in STEP 7. The etching is terminated so as to leave a predetermined thickness of the substrate remained layer 1*m* at the bottom of the grooves, and the device wafer W is then broken at the substrate remained layer 1*m* to thereby separate it into the individual device chips 100C. The projected portion 1*f* is thus formed by the substrate remained layer 1*m*.

Figure 8:
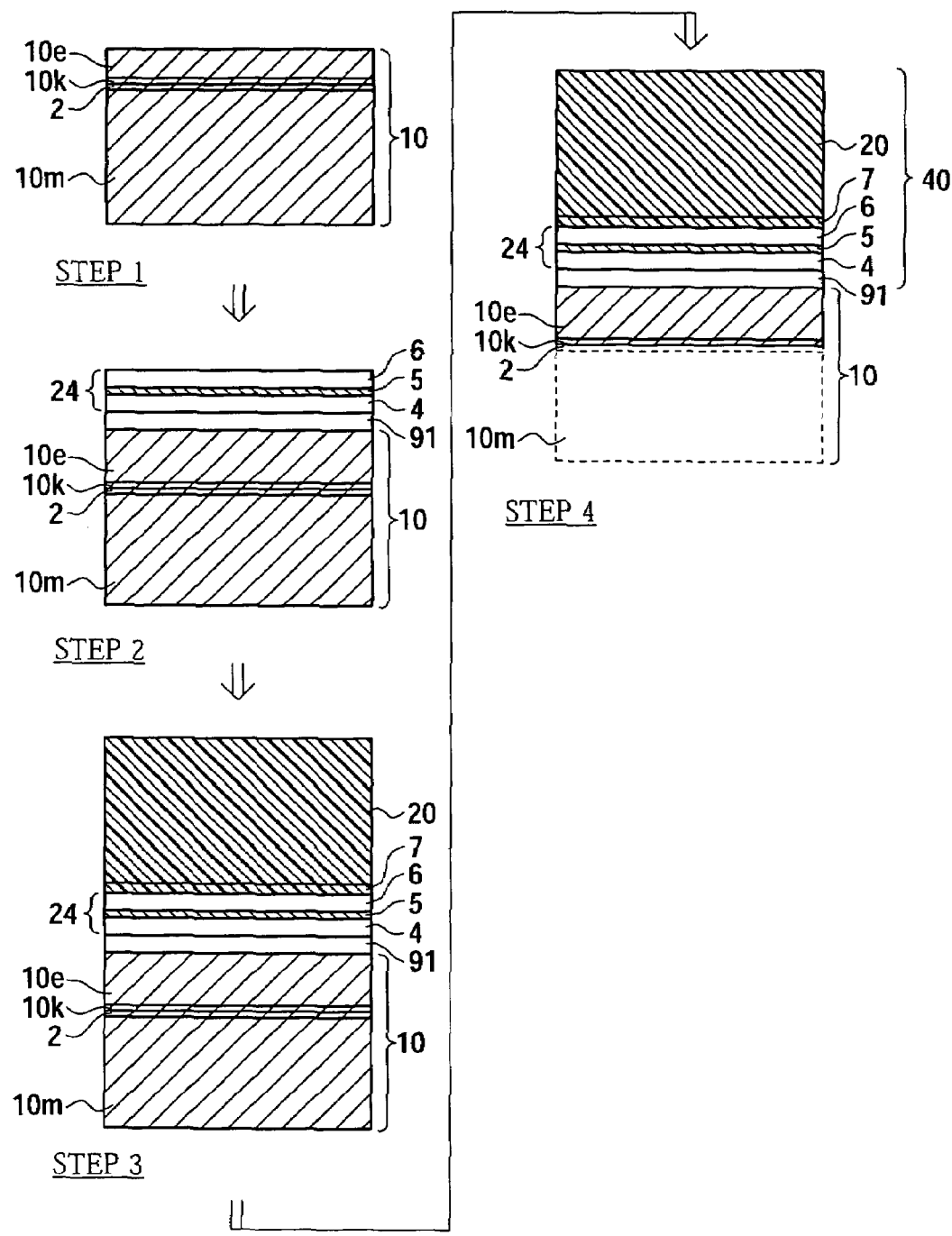
FIG. 8 is a drawing explaining a modified example of a series of process steps of fabricating the residual substrate portion.

STEP 1 to STEP 4 in FIG. 3 may be replaced with STEP 1 to STEP 4 in FIG. 8 As shown in STEP 1 in FIG. 8, the buffer layer 2 composed of GaAs is epitaxially grown on the first main surface of a main substrate portion 10*m* composed of an n-type GaAs single crystal, an etching stop layer 10*k* (typically composed of AlInP) is then epitaxially grown thereon as a separatory compound semiconductor layer, and a sub-substrate portion 10*e* composed of an n-type GaAs single crystal is epitaxially grown further on the etching stop layer 10*k*, to thereby obtain a composite, growth substrate 10 on which the light emitting layer portion 24 will be .grown later. The sub-substrate portion 10*e* is formed by the MOVPE process or the HVPE process. The light emitting layer portion 24 and the transparent thick semiconductor layer 20 are then epitaxially grown on the first main surface of the sub-substrate portion 10*e* of the composite growth substrate 10, as shown in STEP 2 and STEP 3, similarly to as shown in FIG. 3, without forming the buffer layer.

The process then advances to STEP 4, wherein the composite growth substrate 10 is thinned. More specifically, the main substrate portion 10*m* and the GaAs buffer layer 2 are etched off using a first etching solution (for example, ammonia/hydrogen peroxide mixed solution) having an etching selectivity to GaAs. The etching stop layer 10*k* is then etched off using a second etching solution (hydrogen chloride for example: may be added with hydrofluoric acid for removing Al oxide layer) having an etching selectivity to AlInP. It is also allowable herein to adopt a procedure in which a separating layer typically composed of AlAs is formed as a separatory compound semiconductor layer, in place of the etching stop layer 10*k*, and the separating layer is then selectively etched by immersing the composite growth substrate into an etching solution typically composed of a 10% aqueous hydrofluoric acid solution, to thereby separate the main substrate portion 10*m*. Thus remained sub-substrate portion 10*e* can similarly be used for forming the residual substrate portion 11, as a component correspondent to the. substrate bulk 1' shown in FIG. 3.

Figure 9:
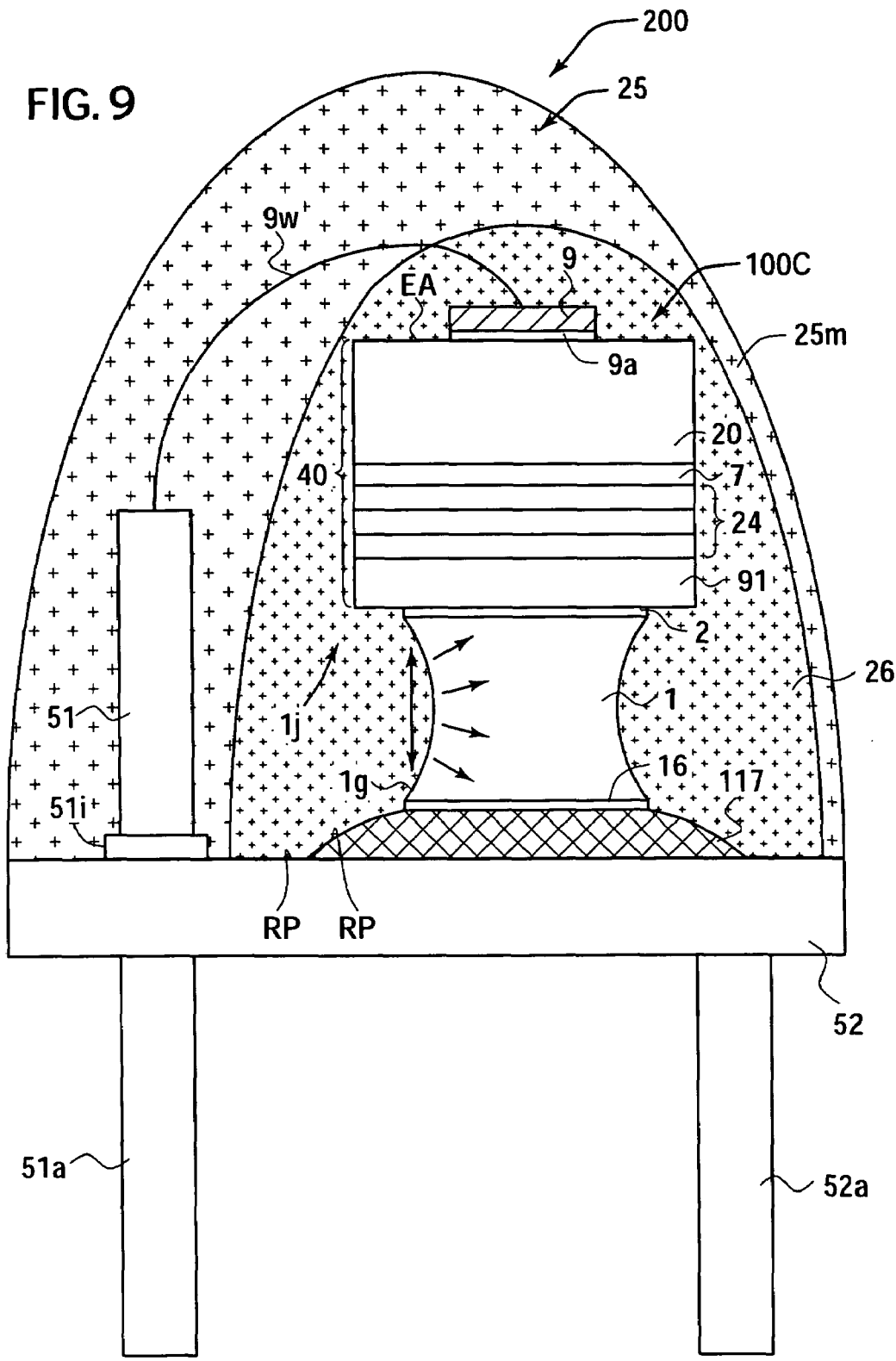
FIG. 9 is a schematic sectional view showing a second modified example of the light emitting device shown in FIG. 1.
Figure 10:
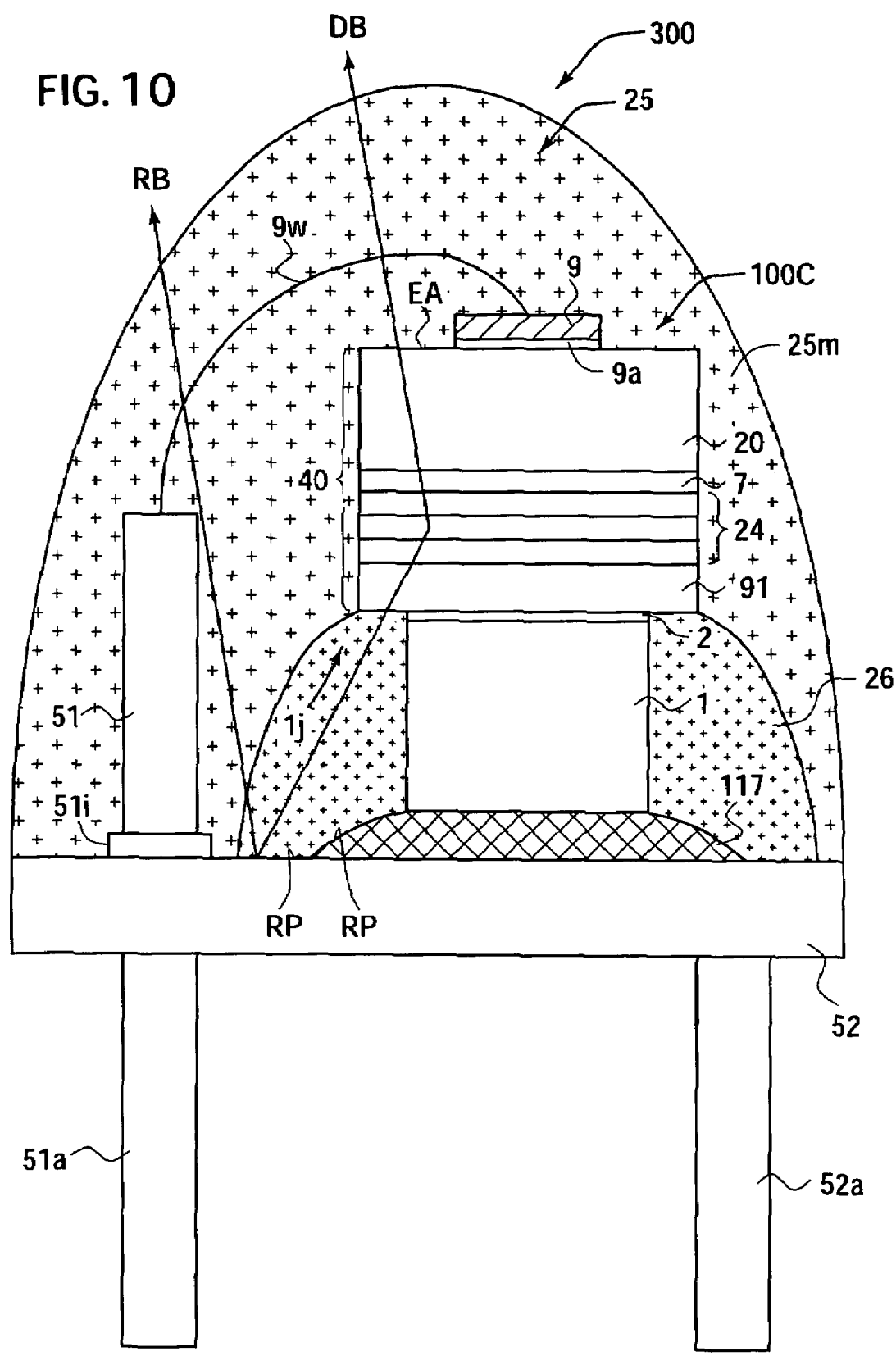
FIG. 10 is a schematic sectional view showing a third modified example of the light emitting device shown in FIG. 1.
Figure 12:
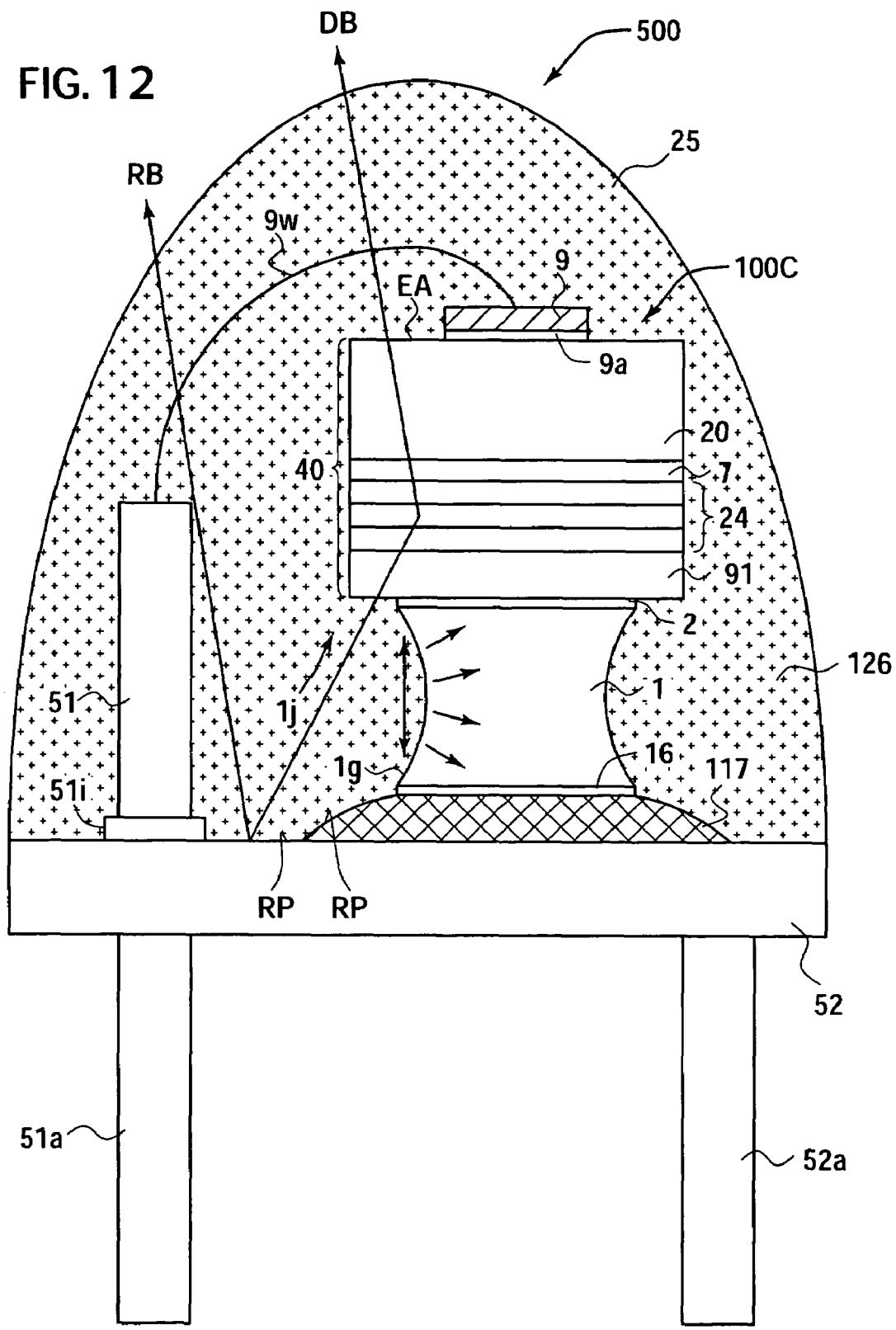
FIG. 12 is a schematic sectional view showing a fifth modified example of the light emitting device shown in FIG. 1.

A configuration, as shown in a light emitting device 200 shown in FIG. 9, is also adoptable, wherein the entire portion of the device chip 100C, including the main light extraction surface and the side face of the main compound semiconductor layer 40, is covered by the first molding layer 26. As a consequence, the first molding layer 26 can more readily be formed by coating a silicon resin or the like. For the case where the refractive index of the silicone resin is smaller than that of the epoxy resin composing the second molding layer 25*m*, it is preferable to minimize as possible the thickness of a portion of the first molding layer 26 covering the main light extraction surface and side face of the main compound semiconductor layer 40, in view of improving the light extraction efficiency. For the case where the expansion-induced stress causative of separation of the device chip 100C can thoroughly be reduced by the first molding layer 26, the side face of the residual substrate portion 1 may be formed upright, as in a light emitting device 300 shown in FIG. 10. For the case where a silicone resin has an appropriate hardness, typically having a type-A durometric hardness specified by JIS: K6253 of 17 or larger, more preferably 30 or larger (such as the above-described KJR-9022, KJR-9023, KJR-9025 or the like, allowing any other transparent soft urethane resin so far as it has an equivalent hardness), an effect of preventing separation of the device chip 100C can be achieved, even by adopting a molding component 126, as in a light emitting device 500 shown in FIG. 12, having the entire portion thereof composed of such resin.

Figure 11:
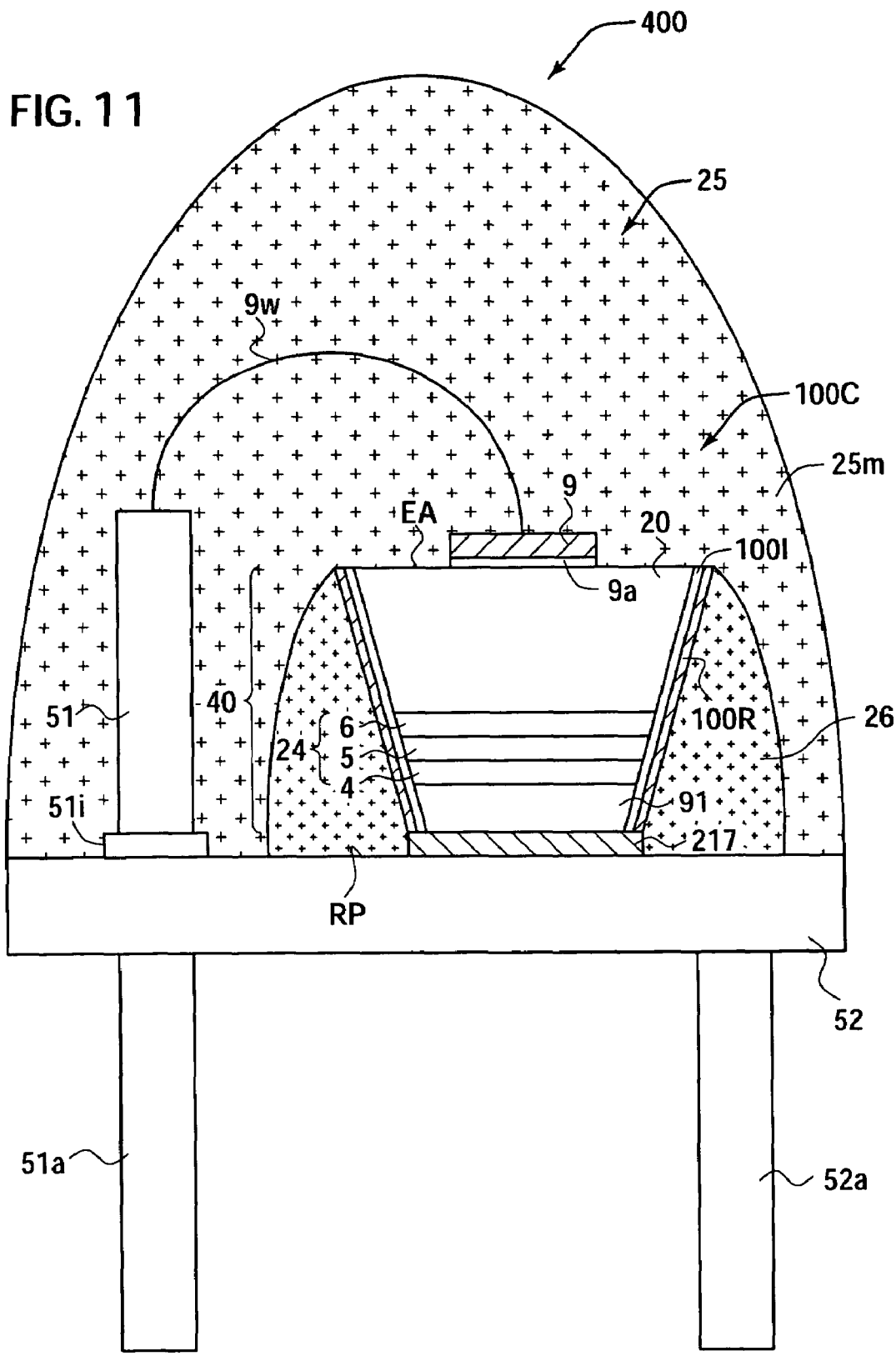
FIG. 11 is a schematic sectional view showing a fourth modified example of the light emitting device shown in FIG. 1.

It is still also allowable to configure the side face of the device chip 100C, as in a light emitting device 400 shown in FIG. 11, as an inclined surface so as to continuously reduce the sectional area of the device chip 100C at least in a partial region (entire region in this embodiment) in the thickness-wise direction thereof as viewed from the first main surface towards the second main surface. The inclined surface is covered with a reflective metal layer 100R composed of a Au layer or the like, while placing an insulating layer 100I composed of a polymer material or a ceramic material in between. A portion correspondent to the residual substrate portion 1 shown in FIG. 1 is not formed. The. electro-conductive adhesive layer is composed of an Au wax layer 217, in place of the metal paste layer. The inclined surface composes the section reducing portion, entire portion of which being covered with the first molding layer, and is successfully prevented from separating from the Au wax layer 217 due to expansion-induced stress of the molding material. On the other hand, the main light extraction surface of the device chip 100C is covered with the second molding layer 26*m*.

(Second Invention)

Figure 13:
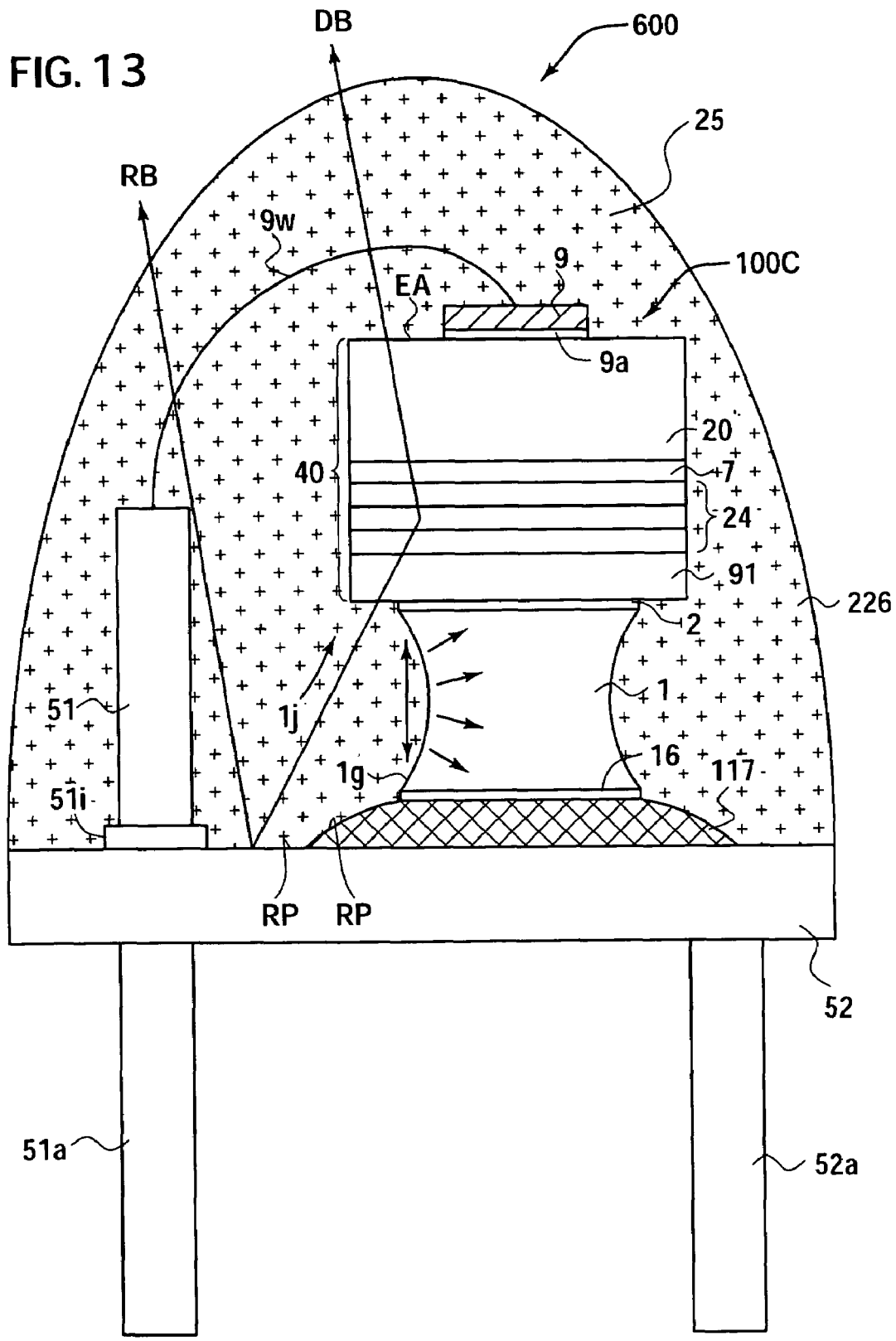
FIG. 13 is a schematic sectional view showing an example of the light emitting device of the second invention.

Paragraphs below will explain best modes for carrying out the second invention, referring to the attached drawings. It is to be noted herein that the light emitting device of the second invention is given in common, in many aspects, with the light emitting device 100 previously explained referring to FIG. 1 to FIG. 8, so that any common constituents will be given with the same reference numerals, allowing omission of detailed description. A light emitting device 600 shown in FIG. 13 has the device chip 100C (see FIG: 2) configured absolutely same as the light emitting device 100 shown in FIG. 1 (method of fabrication is also the same as explained referring to FIG. 3 to FIG. 5). The device chip 100C is covered with the molding component 25 composed of a polymer molding material having transparency to the emission flux from the light emitting layer portion 24, that is herein a single molding layer 226 composed of an epoxy resin, on the metal stage 52 together with the metal paste layer 117. The molding component 25 is formed so that the cut-off portion 1j of the device chip 100C is filled with the epoxy resin In this embodiment, the entire portion of the molding component 25 is composed of the epoxy resin, and the cut-off portion 1j is consequently filled with the epoxy resin. The residual substrate portion (base semiconductor layer) 1 has formed therein a section increasing portion 1g in which the sectional area normal to the thickness-wise direction continuously increases from a position in the midway of the thickness-wise direction thereof towards the second main surface side faced to the metal stage 52 for adhesion. More specifically, the residual substrate portion 1 is formed so,as to have a recessed curved sectional geometry on the side face thereof in the cut-off portion 1j, and so that a portion thereof located more closer to the second main surface side as viewed from a position of the bottom of the curved side face in the thickness-wise direction forms the section increasing portion 1g.

The device chip 100C having the cut-off portion 1j formed therein produces a strong expansion-induced stress in a stretching manner between the bottom of the cut-off portion 1j (exposed outer circumferential surface of the auxiliary current spreading layer 91 in an illustrated case) and the top surface of the metal stage 52, when the epoxy resin filled in the cut-off portion 1j expands typically due to heat generation under current supply The expansion-induced stress under expansion of the epoxy resin filled in the cut-off portion 1j, however, acts at the section increasing portion 1g so as to pressurize the residual substrate portion 1, and consequently the device chip 100C, against the metal paste layer 117 (electro-conductive adhesive layer). This consequently makes it possible to suppress effectively nonconformity such that the device chip 100C floats up and separates from the metal paste layer 117. The side face of the residual substrate portion 1 formed so as to have a recessed curved sectional geometry is contributive to diffuse the expansion-induced stress of the epoxy resin filled in the cut-off portion 1j into various directions along the curved surface, and typically makes the device chip 100C further less likely to separate.

Also in the light emitting device of the second invention, it is allowable, as in the light emitting device 700 shown in FIG. 6, to form an outwardly-projecting, flange-like projected portion 1f on the side face of the residual substrate portion 1, at the end position thereof on the second main surface side in the thickness-wise direction, so as to compose at least a portion of the section increasing portion 1g. Process steps same as those shown in FIG. 7 are adoptable for a method of fabricating the projected portion 1f.

It is to be understood that the light emitting devices 100, 700, 200 and 300 shown in FIG. 1, FIG. 6, FIG. 9 and FIG. 10 possess features of the second invention, and also those expressing the embodiments of the second invention.

What is claimed is:

1. A light emitting device configured:

so that a device chip, having a light emitting layer portion and a main light extraction surface formed on a first main surface thereof, is adhered on the second main surface side thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion; and so that the device chip has a section reducing portion formed in at least a portion in the thickness-wise direction thereof, wherein the sectional area normal to the thickness-wise direction continuously or step-wisely decreases from the first main surface side towards the second main surface side, a portion of the molding component comprises a first molding layer covering at least the section reducing portion and a second molding layer covering the exterior of the first molding layer, wherein the first molding layer is composed of a polymer molding material softer than that composing the second molding layer, wherein:

the device chip comprises a main compound semiconductor layer having a light emitting layer portion and a main light extraction surface formed on the first main surface side thereof; and a base semiconductor layer disposed on the second main surface side of the main compound semiconductor layer, the second main surface of the base semiconductor layer being adhered to the metal stage while placing an electro-conductive adhesive layer in between; and the base semiconductor layer has a cut-off portion formed therein, so that at least a portion thereof right under the main light extraction surface is aimed to be cut off, so that a residual portion produced as a result of cutting off contains at least a portion thereof right under a main light extraction electrode, and so that at least the bottom surface of the cut-off portion configures the section reducing portion.

2. The light emitting device as claimed in claim 1, wherein the first molding layer is composed of a silicone resin.

3. The light emitting device as claimed in claim 1, wherein at least a portion of the second molding layer is composed of an epoxy resin.

4. A light emitting device configured:

so that a device chip, having a light emitting layer portion and a main light extraction surface formed on the first main surface thereof, is adhered on the second main surface side thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion; and so that the device chip has a section reducing portion formed in at least a portion in the thickness-wise direction thereof, wherein the sectional area normal to the thickness-wise direction continuously or step-wisely decreases from the first main surface side towards the second main surface side, and the molding component is configured at least by a polymer molding material composed of a silicone resin, in the portion thereof covering the section reducing portion, wherein:

the device chip comprises a main compound semiconductor layer having a light emitting layer portion and a main light extraction surface formed on the first main surface side thereof; and a base semiconductor layer disposed on the second main surface side of the main compound semiconductor layer, the second main surface of the base semiconductor layer being adhered to the metal stage while placing an electro-conductive adhesive layer in between; and the base semiconductor layer has a cut-off portion formed therein, so that at least a portion thereof right under the main light extraction surface is aimed to be cut off, so that a residual portion produced as a result of cutting off contains at least a portion thereof right under a main light extraction electrode, and so that at least the bottom surface of the cut-off portion configures the section reducing portion.

5. A light emitting device configured: so that a device chip, having a light emitting layer portion and a main light extraction surface formed on the first main surface thereof, is adhered on the second main surface side thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion; and so that the device chip has a section reducing portion formed in at least a portion in the thickness-wise direction thereof, wherein the sectional area normal to the thickness-wise direction continuously or step-wisely decreases from the first main surface side towards the second main surface side, and the molding component is configured at least by a polymer molding material composed of a soft material having a type-A durometric hardness specified by JIS:K6253 of 50 or smaller, in the portion thereof covering the section reducing portion, wherein:

the device chip comprises a main compound semiconductor layer having a light emitting layer portion and a main light extraction surface formed on the first main surface side thereof and a base semiconductor layer disposed on the second main surface side of the main compound semiconductor layer, the second main surface of the base semiconductor layer being adhered to the metal stage while placing an electro-conductive adhesive layer in between; and the base semiconductor layer has a cut-off portion formed therein, so that at least a portion thereof right under the main light extraction surface is aimed to be cut off, so that a residual portion produced as a result of cutting off contains at least a portion thereof right under a main light extraction electrode, and so that at least the bottom surface of the cut-off portion configures the section reducing portion.

6. The light emitting device as claimed in claim 2, wherein an Ag paste layer is formed as the electro-conductive adhesive layer so as to run off around the periphery of the second main surface of the device chip, the run-off surface of the Ag paste layer composes a paste reflective surface, and the paste reflective surface is covered with the polymer molding material composed of a silicone resin.

7. The light emitting device as claimed in claim 1, wherein the base semiconductor layer has a section increasing portion in which the sectional area normal to the thickness-wise direction continuously or step-wisely increases from a position at least in the midway of the thickness-wise direction towards the second main surface side thereof faced to the metal stage for adhesion.

8. The light emitting device as claimed in claim 1, wherein the base semiconductor layer is formed so as to have a recessed curved sectional geometry on the side face thereof in the cut-off portion, and so that a portion thereof located more closer to the second main surface side as viewed from a position of the bottom of the curved side face in the thickness-wise direction forms the section increasing portion.

9. The light emitting device as claimed in claim 7, wherein the base semiconductor layer has an outwardly-projecting, flange-like projected portion formed on the side face thereof, at the end position on the second main surface side in the thickness-wise direction, so as to compose at least a portion of the section increasing portion.

10. The light emitting device as claimed in claim 1, wherein the main compound semiconductor layer is epitaxially grown on the first main surface of a light-absorptive compound semiconductor substrate, wherein a partial region of the first main surface of the main compound semiconductor layer is used as a main light extraction surface, and a light extraction side electrode through which operation voltage for emission is applied to the light emitting layer portion, is formed so as to cover a portion of the first main surface of the main compound semiconductor layer; and the light-absorptive compound semiconductor substrate has the cut-off portion formed therein, so that at least a portion thereof right under the main light extraction surface is aimed to be cut off, so that a residual substrate portion produced as a result of cutting off contains at least a portion thereof right under the main light extraction electrode, and so that at least the residual substrate portion forms the base semiconductor layer.

11. The light emitting device as claimed in claim 1, wherein the device chip is configured so that the side face thereof is formed as an inclined surface, at least in a portion in the thickness-wise direction thereof from the first main surface towards the second main surface, so as to continuously reduce the sectional area, wherein the first molding layer is formed so as to cover the inclined surface.

12. A light emitting device configured:

so that a device chip, having a main compound semiconductor layer having therein a light emitting layer portion and a main light extraction surface formed on the first main surface thereof, and a light-absorptive base semiconductor layer disposed-on the second main surface side of the main compound semiconductor layer, is adhered on the second main surface of the base semiconductor layer thereof to a metal stage while placing an electro-conductive adhesive layer in between, and is covered on the metal stage together with the electro-conductive adhesive layer, using a molding component which is composed of a polymer molding material having transparency to emission flux from the light emitting layer portion;

so that the base semiconductor layer has a cut-off portion formed therein, so that at least a portion thereof right under the main light extraction surface is aimed to be cut off, and so that a residual portion produced as a result of cuffing off contains at least a portion thereof right under the light extraction side electrode; and so that the second main surface of the base semiconductor layer having the cut-off portion formed therein is adhered to a metal stage while placing an electro-conductive adhesive layer in between, and the device chip in this state is covered with a molding component so that the cut-off portion is filled with a polymer molding material, wherein the base semiconductor layer has a section increasing portion in which the sectional area normal to the thickness-wise direction increases from a position at least in the midway of the thickness-wise direction towards the second main surface side thereof faced to the metal stage for adhesion.

13. The light emitting device as claimed in claim 12, wherein at least a portion of the molding layer is composed of an epoxy resin.

14. The light emitting device as claimed in claim 13, wherein the cut-off portion is filled with the epoxy resin.

15. The light emitting device as claimed in claim 12, wherein the base semiconductor layer is formed so as to have a recessed curved sectional geometry on the side face thereof in the cut-off portion, and so that a portion thereof located more closer to the second main surface side as viewed from a position of the bottom of the curved side face in the thickness-wise direction forms the section increasing portion.

16. The light emitting device as claimed in claim 12, wherein the base semiconductor layer has an outwardly-projecting, flange-like projected portion formed on the side face thereof, at the end position on the second main surface side in the thickness-wise direction, so as to compose at least a portion of the section increasing portion.

17. The light emitting device as claimed in claim 12, wherein the main compound semiconductor layer is epitaxially grown on the first main surface of a light-absorptive compound semiconductor substrate, uses a partial region of the first main surface of the main compound semiconductor layer as a main light extraction surface, and has the light extraction side electrode through which operation voltage for emission is applied to the light emitting layer portion, formed so as to cover a portion of the first main surface of the main compound semiconductor layer; and the light-absorptive compound semiconductor substrate has the cut-off portion formed therein, so that at least a portion thereof right under the main light extraction surface is aimed to be cut off, so that a residual substrate portion produced as a result of cutting off contains at least a portion thereof right under the main light extraction electrode, and so that at least the residual substrate portion forms the base semiconductor layer.

18. The light emitting device as claimed in claim 2, wherein at least a portion of the second molding layer is composed of an epoxy resin.

19. The light emitting device as claimed in claim 18, wherein an Ag paste layer is formed as the electro-conductive adhesive layer so as to run off around the periphery of the second main surface of the device chip, the run-off surface of the Ag paste layer composes a paste reflective surface, and the paste reflective surface is covered with the polymer molding material composed of a silicone resin.

20. The light emitting device as claimed in claim 4, wherein an Ag paste layer is formed as the electro-conductive adhesive layer so as to run off around the periphery of the second main surface of the device chip, the run-off surface of the Ag paste layer composes a paste reflective surface, and the paste reflective surface is covered with the polymer molding material composed of a silicone resin.

21. The light emitting device as claimed in claim 5, wherein an Ag paste layer is formed as the electro-conductive adhesive layer so as to run off around the periphery of the second main surface of the device chip, the run-off surface of the Ag paste layer composes a paste reflective surface, and the paste reflective surface is covered with the polymer molding material composed of a silicone resin.

22. The light emitting device as claimed in claim 4, wherein the base semiconductor layer has a section increasing portion in which the sectional area normal to the thickness-wise direction continuously or step-wisely increases from a position at least in the midway of the thickness-wise direction towards the second main surface side thereof faced to the metal stage for adhesion.

23. The light emitting device as claimed in claim 5, wherein the base semiconductor layer has a section increasing portion in which the sectional area normal to the thickness-wise direction continuously or step-wisely increases from a position at least in the midway of the thickness-wise direction towards the second main surface side thereof faced to the metal stage for adhesion.

24. The light emitting device as claimed in claim 4, wherein the base semiconductor layer is formed so as to have a recessed curved sectional geometry on the side face thereof in the cut-off portion, and so that a portion thereof located more closer to the second main surface side as viewed from a position of the bottom of the curved side face in the thickness-wise direction forms the section increasing portion.

25. The light emitting device as claimed in claim 5, wherein the base semiconductor layer is formed so as to have a recessed curved sectional geometry on the side face thereof in the cut-off portion, and so that a portion thereof located more closer to the second main surface side as viewed from a position of the bottom of the curved side face in the thickness-wise direction forms the section increasing portion.

26. The light emitting device as claimed in claim 22, wherein the base semiconductor layer has an outwardly-projecting, flange-like projected portion formed on the side face thereof, at the end position on the second main surface side in the thickness-wise direction, so as to compose at least a portion of the section increasing portion.

27. The light emitting device as claimed in claim 23, wherein the base semiconductor layer has an outwardly-projecting, flange-like projected portion formed on the side face thereof, at the end position on the second main surface side in the thickness-wise direction, so as to compose at least a portion of the section increasing portion.

28. The light emitting device as claimed in claim 8, wherein the base semiconductor layer has an outwardly-projecting, flange-like projected portion formed on the side face thereof, at the end position on the second main surface side in the thickness-wise direction, so as to compose at least a portion of the section increasing portion.

29. The light emitting device as claimed in claim 24, wherein the base semiconductor layer has an outwardly-projecting, flange-like projected portion formed on the side face thereof, at the end position on the second main surface side in the thickness-wise direction, so as to compose at least a portion of the section increasing portion.

30. The light emitting device as claimed in claim 25, wherein the base semiconductor layer has an outwardly-projecting, flange-like projected portion formed on the side face thereof, at the end position on the second main surface side in the thickness-wise direction, so as to compose at least a portion of the section increasing portion.

31. The light emitting device as claimed in claim 4, wherein the main compound semiconductor layer is epitaxially grown on the first main surface of a light-absorptive compound semiconductor substrate, wherein a partial region of the first main surface of the main compound semiconductor layer is used as a main light extraction surface, and a light extraction side electrode through which operation voltage for emission is applied to the light emitting layer portion, is formed so as to cover a portion of the first main surface of the main compound semiconductor layer; and the light-absorptive compound semiconductor substrate has the cut-off portion formed therein, so that at least a portion thereof right under the main light extraction surface is aimed to be cut off, so that a residual substrate portion produced as a result of cutting off contains at least a portion thereof right under the main light extraction electrode, and so that at least the residual substrate portion forms the base semiconductor layer.

32. The light emitting device as claimed in claim 5, wherein the main compound semiconductor layer is epitaxially grown on the first main surface of a light-absorptive compound semiconductor substrate, wherein a partial region of the first main surface of the main compound semiconductor layer is used as a main light extraction surface, and a light extraction side electrode through which operation voltage for emission is applied to the light emitting layer portion, is formed so as to cover a portion of the first main surface of the main compound semiconductor layer; and the light-absorptive compound semiconductor substrate has the cut-off portion formed therein, so that at least a portion thereof right under the main light extraction surface is aimed to be cut off, so that a residual substrate portion produced as a result of cutting off contains at least a portion thereof right under the main light extraction electrode, and so that at least the residual substrate portion forms the base semiconductor layer.

* * * * *